(12) United States Patent
Kim et al.

(10) Patent No.: US 12,557,712 B2
(45) Date of Patent: Feb. 17, 2026

(54) SEMICONDUCTOR PACKAGE

(71) Applicant: Samsung Electronics Co., Ltd., Suwon-si (KR)

(72) Inventors: Sunchul Kim, Suwon-si (KR); Junwoo Park, Suwon-si (KR); Hyunggil Baek, Suwon-si (KR); Yongkwan Lee, Suwon-si (KR); Juhyung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 521 days.

(21) Appl. No.: 18/110,994

(22) Filed: Feb. 17, 2023

(65) Prior Publication Data

US 2023/0411259 A1  Dec. 21, 2023

(30) Foreign Application Priority Data

May 24, 2022  (KR) ........................ 10-2022-0063377

(51) Int. Cl.
*H01L 23/48* (2006.01)
*H01L 23/31* (2006.01)
(Continued)

(52) U.S. Cl.
CPC .... *H01L 23/49811* (2013.01); *H01L 23/3128* (2013.01); *H01L 23/49822* (2013.01); *H01L 23/49833* (2013.01); *H01L 24/16* (2013.01); *H01L 25/0657* (2013.01); *H01L 25/18* (2013.01); *H01L 2224/16227* (2013.01);
(Continued)

(58) Field of Classification Search
CPC ........... H01L 23/49811; H01L 23/3128; H01L 23/49822; H01L 23/49833; H01L 24/16; H01L 21/56; H01L 23/5385; H01L 23/49816
See application file for complete search history.

(56) References Cited

U.S. PATENT DOCUMENTS 10,510,672 B2  12/2019  Kim et al.
10,672,715 B2   6/2020  Kweon et al.
(Continued)

FOREIGN PATENT DOCUMENTS

KR  1020200038090 A  4/2020
KR    102262907 B1   6/2021
KR  1020220001311    1/2022

*Primary Examiner* — Nicholas J Tobergte
(74) *Attorney, Agent, or Firm* — Muir Patent Law, PLLC

(57) ABSTRACT

A semiconductor package includes: a lower substrate; a semiconductor chip disposed on the lower substrate; an upper substrate disposed on the semiconductor chip, having a lower surface facing the semiconductor chip, and including step structures disposed below the lower surface; a connection structure disposed around the semiconductor chip and connecting the lower substrate to the upper substrate; and an encapsulant filling a space between the lower substrate and the upper substrate and sealing at least a portion of each of the semiconductor chip and the connection structure. The lower surface of the upper substrate has a first surface portion on which the step structures are disposed and a second surface portion having a step with respect to the lower surface of the step structures, and the second surface portion extends between opposite edges of the upper substrate.

20 Claims, 19 Drawing Sheets

(51) Int. Cl.
*H01L 23/498* (2006.01)
*H01L 23/00* (2006.01)
*H01L 25/065* (2023.01)
*H01L 25/18* (2023.01)

(52) U.S. Cl.
CPC .............. *H01L 2225/06506* (2013.01); *H01L 2225/0651* (2013.01); *H01L 2225/06562* (2013.01)

(56) References Cited

U.S. PATENT DOCUMENTS

| | | |
|---|---|---|
| 11,164,754 B2 | 11/2021 | Tsai et al. |
| 2013/0161836 A1 | 6/2013 | Yeom et al. |
| 2016/0056103 A1* | 2/2016 | Kim ...................... H01L 25/074 257/774 |
| 2020/0035658 A1 | 1/2020 | Singh et al. |
| 2021/0366818 A1 | 11/2021 | Kim |
| 2022/0068904 A1* | 3/2022 | Park .................... H01L 23/5383 |
| 2022/0278049 A1* | 9/2022 | Kim ........................ H01L 24/20 |
| 2022/0415778 A1* | 12/2022 | Park .................... H01L 23/5389 |
| 2023/0117654 A1* | 4/2023 | Kim ........................ H01L 23/16 257/723 |

* cited by examiner

SEMICONDUCTOR PACKAGE

CROSS-REFERENCE TO RELATED APPLICATION(S)

This application claims benefit of priority to Korean Patent Application No. 10-2022-0063377 filed on May 24, 2022 in the Korean Intellectual Property Office, the disclosure of which is incorporated herein by reference in its entirety.

BACKGROUND

The present disclosure relates to a semiconductor package.

In accordance with the recent trend for high performance and miniaturization of electronic devices, package-on-package (POP) technology has been developed in the semiconductor packaging field. In the package-on-package technology, two or more semiconductor packages are vertically stacked, and thus, development of technology for minimizing the thickness of a final package structure is beneficial.

SUMMARY

An aspect of the present disclosure is to provide a semiconductor package having a minimized thickness.

According to an aspect of the present disclosure, a semiconductor package includes: a lower substrate including a lower wiring layer structure; a semiconductor chip disposed on the lower substrate and electrically connected to the lower wiring layer structure; an upper substrate disposed on the semiconductor chip, having a lower surface facing the semiconductor chip, first edges opposing each other in a first direction, and second edges opposing each other in a second direction, intersecting the first direction, and including first step structures extending in the second direction, below the lower surface and adjacent to the first edges, and an upper wiring layer structure; a connection structure disposed between the lower substrate and the upper substrate to connect the lower wiring layer structure and the upper wiring layer structure and including first connectors adjacent to the first edges and second connectors adjacent to the second edges; an encapsulant filling a space between the lower substrate and the upper substrate and sealing at least a portion of each of the semiconductor chip and the connection structure; and connection bumps disposed below the lower substrate and electrically connected to the lower wiring layer structure. The semiconductor package has a channel region below the lower surface of the upper substrate, the channel region extending between the second edges and passing through a space between the second connectors.

According to another aspect of the present disclosure, a semiconductor package includes: a lower substrate including a lower wiring layer structure; a semiconductor chip disposed on the lower substrate and electrically connected to the lower wiring layer; an upper substrate disposed on the semiconductor chip, having a lower surface facing the semiconductor chip, and including step structures arranged at a first vertical level below the lower surface and an upper wiring layer structure; a connection structure disposed between the lower substrate and the upper substrate to electrically connect the lower wiring layer structure and the upper wiring layer structure, and a cavity region overlapping the semiconductor chip in a direction perpendicular to the lower surface, the cavity region formed between the step structures and between two channel regions between the step structures, the two channel regions each extending to edges of the upper substrate opposing each other and formed at the first vertical level.

According to another aspect of the present disclosure, a semiconductor package includes: a lower substrate; a semiconductor chip disposed on the lower substrate; an upper substrate disposed on the semiconductor chip, having a lower surface facing the semiconductor chip, and including step structures disposed below the lower surface; a connection structure disposed around the semiconductor chip and connecting the lower substrate to the upper substrate; and an encapsulant filling a space between the lower substrate and the upper substrate and sealing at least a portion of each of the semiconductor chip and the connection structure. The lower surface of the upper substrate has a first surface portion on which the step structures are disposed and a second surface portion having a step with respect to the lower surface of the step structures, and the second surface portion extends between opposite edges of the upper substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1A:
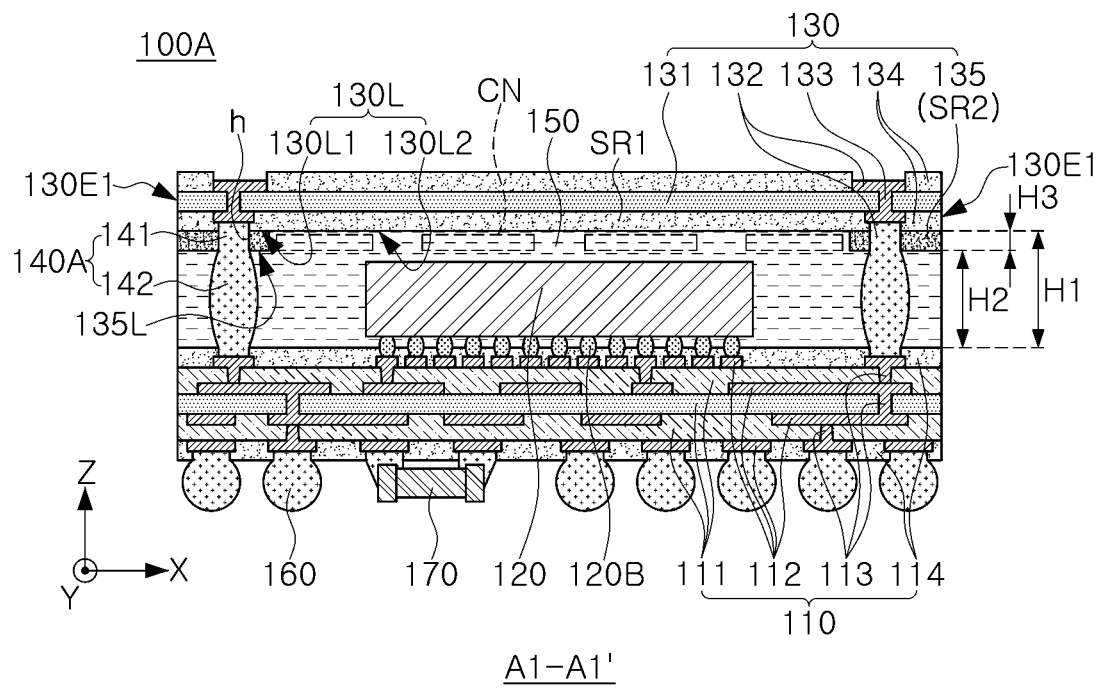
FIGS. 1A to 1C are cross-sectional views illustrating a semiconductor package according to an example embodiment of the present inventive concept.
Figure 1B:
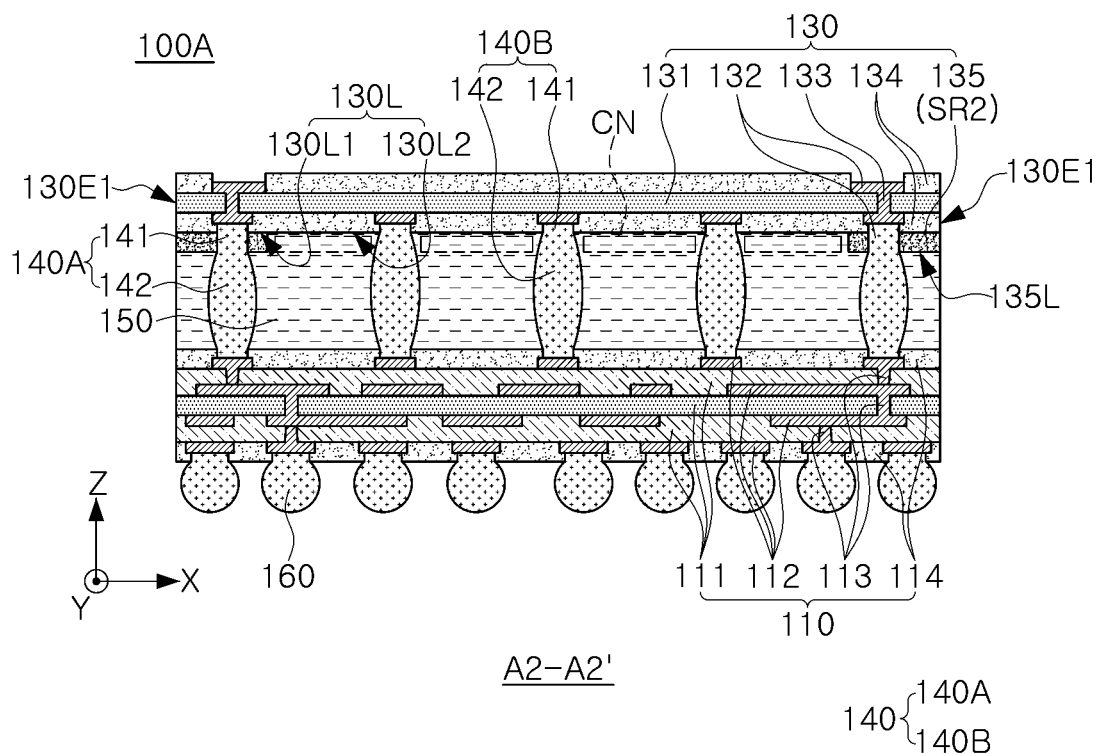
Figure 1C:
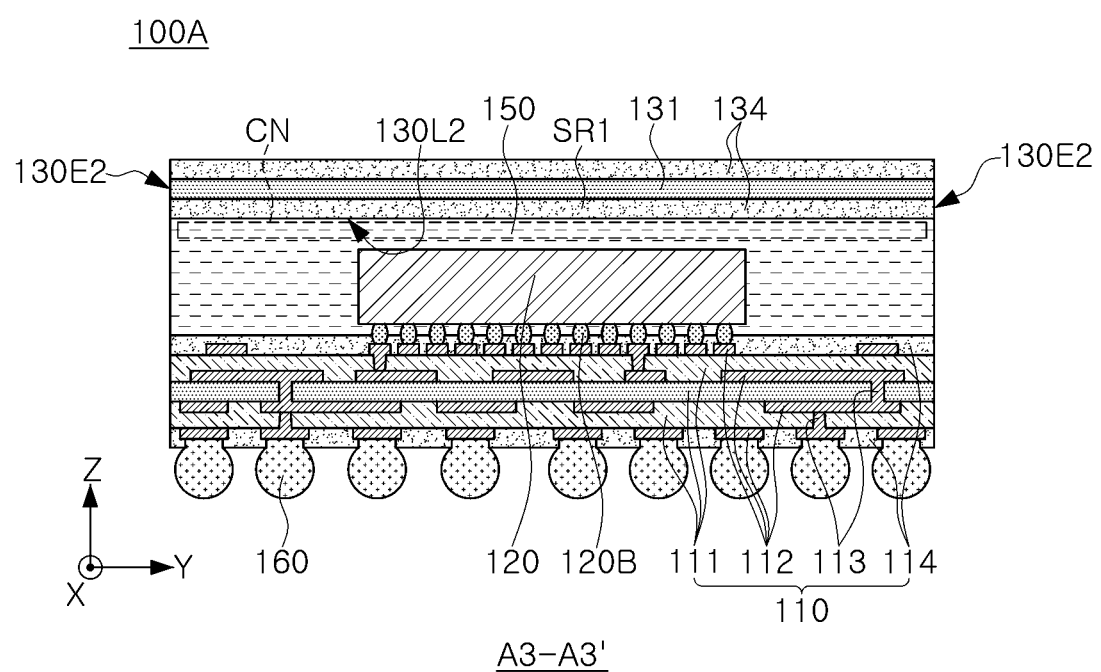
Figure 1D:
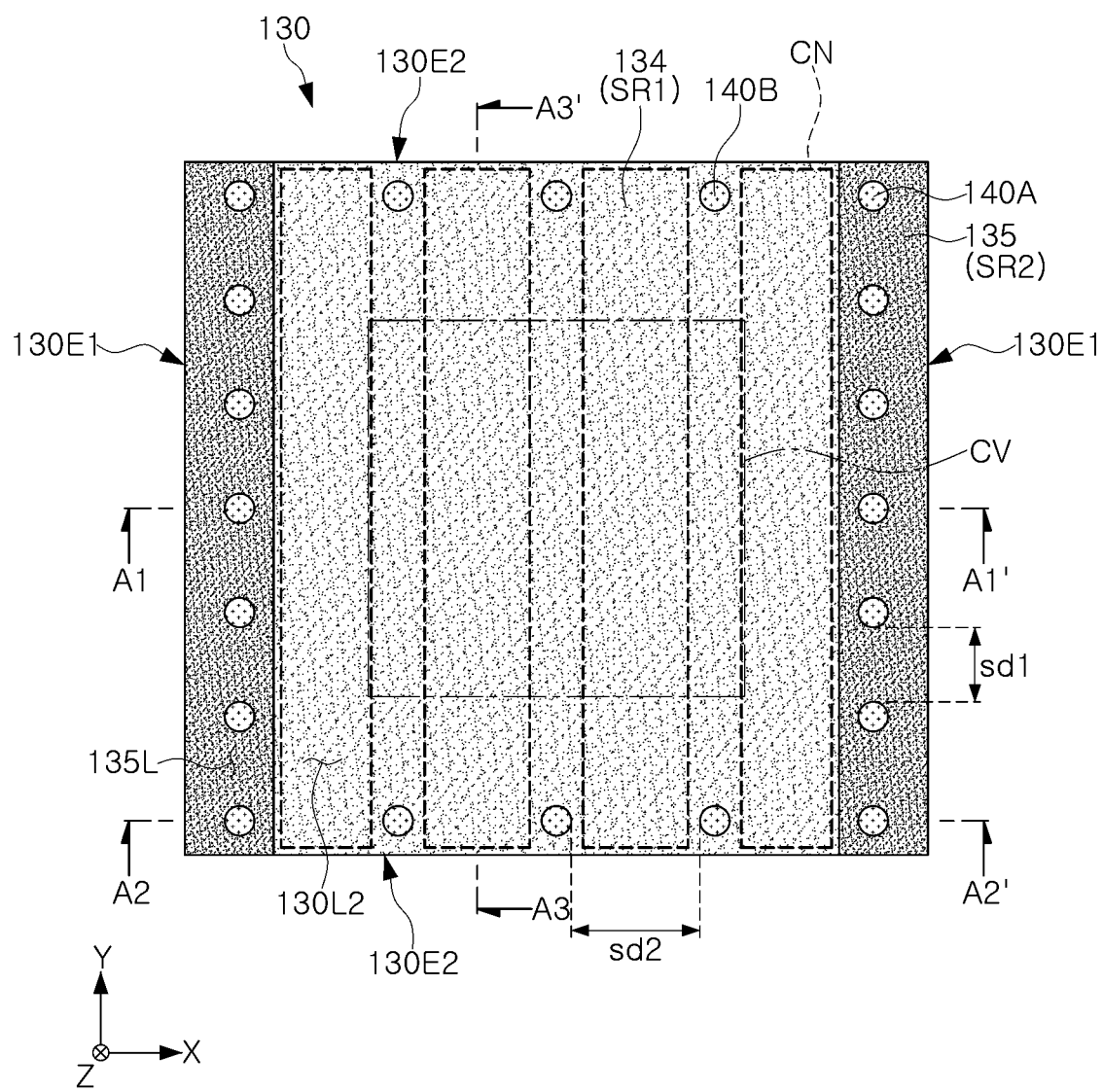
FIG. 1D is a bottom view illustrating an upper substrate of FIGS. 1A to 1C.

FIGS. 1A to 1C are cross-sectional views illustrating a semiconductor package 100A according to an example embodiment of the present inventive concept, and FIG. 1D is a bottom view illustrating an upper substrate 130 of FIGS. 1A to 1C. FIG. 1D illustrates a bottom surface of the upper substrate 130 taken along a lower surface 135L of the step structures 135 and a second surface 130L2 of the upper substrate 130 in order to understand an arrangement relationship between a cavity region CV and a channel region CN. FIGS. 1A, 1B, and 1C illustrate cross-sections of the upper substrate 130 corresponding to lines A1-A1', A2-A2', and A3-A3' of FIG. 1D, respectively.

Referring to FIGS. 1A to 1D, the semiconductor package 100A according to an example embodiment may include a lower substrate 110, a semiconductor chip 120, an upper substrate 130, and a connection structure 140. In addition, the semiconductor package 100A may further include an encapsulant 150, connection bumps 160, and/or a passive element 170.

In the present inventive concept, step structures 135 (or referred to as 'first step structures') are introduced to a lower surface 130L of the upper substrate 130 of the semiconductor package 100A, so that a joint pitch and ball size may be reduced and, as a result, a height of the semiconductor package 100A may be reduced. For example, the joint pitch may be defined as a height of the body portion 142 of the connection structure 140, and the ball size may be defined as a maximum width of the connection structure 140 in a horizontal direction, but is not limited thereto. In addition, a channel region CN extending to an edge (e.g., 'second edges 130E2') of the upper substrate 130 is formed between the step structures 135, thereby securing a distribution path of a cleaning solution (e.g., purified water (DI water)) during a flux cleaning process and a distribution path of a molding resin (e.g., EMC) in a molding process for forming an encapsulant 150. Accordingly, flux remaining in the lower portion of the upper substrate 130, in particular, the inside of the step structures 135, may be removed and the molding resin may be smoothly provided. Hereinafter, each component will be described in detail with reference to the drawings.

The lower substrate 110 is a support substrate on which the semiconductor chip 120 is mounted, and may be a package substrate including a lower wiring layer 112 for redistributing the semiconductor chip 120. The package substrate may include or be formed of a printed circuit board (PCB), a ceramic substrate, a glass substrate, a tape wiring board, and the like. For example, the lower substrate 110 may include an insulating layer 111, a lower wiring layer 112, and a lower wiring via 113. Various items, such as a wiring layer and a via, are described at times herein in the singular, but are intended to cover the plural as well. For example, there may be a plurality of lower wiring vias 113 and a plurality of lower wiring layers 112, formed at different vertical heights and different horizontal locations. For example, a plurality of individual wiring layers, each at a different vertical level, may form a lower wiring layer structure. Thus, the term "lower wiring layer structure" may be used to describe the items that together form lower wiring layers 112. The same terminology may be used below in describing the upper wiring layers 132.

The insulating layer 111 may include or be formed of an insulating resin. The insulating resin may include or may be a thermosetting resin such as an epoxy resin, a thermoplastic resin such as polyimide, or a resin impregnated with an inorganic filler and/or glass fiber (glass cloth or glass fabric) in these resins, for example, a prepreg, Ajinomoto build up film (ABF), flame retardant (FR)-4, bismaleimide triazine (BT), or a photosensitive resin such as photo-imageable dielectric (PID). The insulating layer 111 may include a plurality of insulating layers 111 stacked in a vertical direction (a Z-direction). Depending on the process, a boundary between the plurality of insulating layers 111 may be unclear. In addition, for convenience of explanation, only three insulating layers 111 are illustrated in the drawings, but example embodiments of the present inventive concept are not limited thereto. According to an example embodiment, less or more insulating layers 111 than those shown may be formed. For example, a core layer located in the middle of the plurality of insulating layers 111 may be formed using a copper clad laminate (CCL), an unclad copper clad laminate (UCCL), a glass substrate, a ceramic substrate, or the like.

The lower wiring layer 112 may include or be formed of a metal material including, for example, copper (Cu), aluminum (Al), silver (Ag), tin (Sn), gold (Au), nickel (Ni), lead (Pb), titanium (Ti), or alloys thereof. The lower wiring layer 112 may include, for example, a ground (GND) pattern, a power (PWR) pattern, and a signal (S) pattern. The signal (S) pattern may provide a path through which various signals, except for the ground (GND) pattern and the power (PWR) pattern, for example, a data signal, are transmitted/received. The lower wiring layer 112, also described as a lower wiring layer structure 112, may be provided as a plurality of lower wiring layers 112 respectively disposed below the plurality of insulating layers 111. The plurality of lower wiring layers 112 may be electrically connected to each other through wiring vias 113. The lower wiring layers 112 may include connections for the semiconductor chip 120, the connection structure 140, the connection bumps 160, and the landing pads on which the passive element 170 is mounted, respectively. The wiring layers 112 may extend horizontally, and the through wiring vias 113 may extend vertically between layers of the lower wiring layers 112. The landing pads may be formed to have different pitches depending on an object to be mounted. For example, the lowermost lower wiring layer 112 in contact with the connection bumps 160 may be formed to have a greater thickness than the lower wiring layers 112 thereabove. The number of the lower wiring layers 112 may be determined according to the number of the insulating layers 111, and may include greater or fewer layers than those shown in the drawings. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. The same applies for other words, such as above or below or between.

The wiring vias 113 may be electrically connected to the lower wiring layer 112 and may include a signal via, a ground via, and a power via. The wiring vias 113 may include or may be formed of a metal material including, for example, copper (Cu), aluminum (Al), silver (Ag), tin (Sn), gold (Au), nickel (Ni), lead (Pb), titanium (Ti), or alloys thereof. The wiring via 113 may have a form of a filled via in which a metal material is filled in the via hole or a conformal via in which a metal material is formed along an inner wall of the via hole. The wiring via 113 may be integrated with the lower wiring layer 112 to form single integrated units with no grain boundary therebetween, but example embodiments of the present inventive concept are not limited thereto.

The lower substrate 110 may further include a first protective layer 114 covering the uppermost lower wiring layer 112 and the lowermost lower wiring layer 112 for protection from external physical/chemical damage. The first protective layer 114 includes an insulating material, and may be formed using, for example, prepreg, ABF, FR-4, BT, or photo solder resist (PSR). The first protective layer 114, which may be two layers formed at different vertical levels (e.g., an upper layer and a lower layer) may have an opening exposing at least a portion of the lower wiring layer 112.

The semiconductor chip 120 may be disposed on the lower substrate 110 and may be electrically connected to the lower wiring layer 112. The semiconductor chip 120 may be mounted on the lower substrate 110 in a flip-chip method. The semiconductor chip 120 may be connected to the lower wiring layer 112 through bumps in the form of balls or posts. For example, the semiconductor chip 120 may be electrically connected to the lower wiring layer 112 through the solder bump 120B, but is not limited thereto. According to an example embodiment, the semiconductor chip 120 may be directly connected to the lower wiring layer 112 or the wiring via 113 without a separate bump, or may be mounted on the lower substrate 110 by wire bonding. The semiconductor chip 120 may include or be formed of silicon (Si), germanium (Ge), or gallium arsenide (GaAs), and various types of integrated circuits may be formed. An integrated circuit may be a processor chip, such as a central processor (e.g., CPU), a graphics processor (e.g., GPU), a field programmable gate array (FPGA), an application processor (AP), a digital signal processor, a cryptographic processor, a microprocessor, and a microcontroller, but is not limited thereto, and may be a logic chip, such as an analog-to-digital converter, an application-specific integrated chip (ASIC) or a memory chip, such as a volatile memory (e.g., DRAM), non-volatile memory (e.g., ROM and flash memory), etc.

The upper substrate 130 is a redistribution substrate providing a redistribution layer on the upper or rear surface of the semiconductor package 100A, and may be referred to as an interposer substrate positioned between the lower package and the upper package in a package-on-package structure. The upper substrate 130 may have the lower surface 130L facing the semiconductor chip 120 and may include an insulating layer 131, an upper wiring layer 132, a wiring via 133, and the step structures 135. As in the case above, various elements are described in the singular, but are actually included in plural. Also, both the upper wiring layer 132 and lower wiring layer 112 described previously may include a plurality of wiring layer wires at a particular vertical level, the wiring layer wires connecting to conductive components at other vertical levels. The insulating layer 131, the upper wiring layer 132, and the wiring via 133 have characteristics that are the same as or similar to the insulating layer 111, the lower wiring layer 112, and the wiring via 113 of the lower substrate 110, and thus a redundant description will be omitted. In addition, the upper substrate 130 may further include a second protective layer 134 (which may be two layers formed at different respective vertical levels) covering the uppermost upper wiring layer 132 and the lowermost upper wiring layer 132 and protecting the uppermost upper wiring layer 132 and the lowermost upper wiring layer from external physical/chemical damage, and may be formed using, for example, prepreg, ABF, FR-4, BT, or PSR. Aspects of the present inventive concept may minimize the overall height of the semiconductor package 100A and the pitch of the connection structures 140 by introducing the step structures 135 on the lower surface 130L of the upper substrate 130 of the semiconductor package 100A, and may secure a distribution path of a flux cleaning solution and an encapsulant and improve the efficiency and yield of a molding process through a channel region CN formed between the step structures 135.

The step structures 135 may protrude from the lower surface 130L of the upper substrate 130 and may be disposed to be adjacent to the first edges 130E1. For example, in various embodiments, step structures that fully and continuously extend between two edges of the upper substrate 130 may only be formed to extend in a first direction, and no step structures are formed to fully and continuously extend in a second direction crossing the first direction between the other two edges of the upper substrate 130. The upper substrate 130 includes a cavity region CV overlapping the semiconductor chip 120 in a direction (the Z-direction), perpendicular to the lower surface 130L. The cavity region CV may be formed between the step structures 135 opposing each other. The cavity region CV may be formed to include the channel regions CN as well as non-channel regions formed between a height of a top surface of the semiconductor chip 120 and a bottom surface of the upper substrate 130 (e.g., lower surface 130L2). The cavity region CV may overlap the semiconductor chip 120 from a plan view. The cavity region CV may be formed to be between two channel regions (e.g., left-most and right-most channel regions CN in FIG. 1D). The step structures 135 may be disposed near the cavity region CV, and at least a portion of the channel region CN may intersect (from a plan view) or pass through the cavity region CV. Accordingly, from a plan view, at least a portion of the channel region CN may extend from the cavity region CV to the edges (e.g., the second edges 130E2) of the upper substrate 130.

The channel region CN may have a layer height that is substantially equal to or higher than that of the lower surface 130L of the upper substrate 130 in the vertical direction (the Z-direction) in order to improve the flux cleaning effect and the encapsulant filling property. Here, "layer height" may be defined as a height in the vertical direction from an upper surface of the lower substrate 110. For example, a first height H1 from the upper surface of the lower substrate 110 to a lower surface 130L or the second surface 130L2 of the upper substrate 130 may be greater than a second height H2 from the upper surface of the lower substrate 110 to the lower surface 135L of the step structures 135. Accordingly, even when the thickness of the semiconductor chip 120 is increased, the thickness of the semiconductor package 100A may be minimized.

The channel region CN may be understood as a trench region or recess crossing the lower surface 130L of the upper substrate 130 in a direction, intersecting and extending to the edges (e.g., the second edges 130E2) of the upper substrate 130 in which the step structures 135 are not formed. The channel region CN may be formed between side walls of the step structures 135 at the same height as the step structures 135, and may include the same region both before and after the encapsulant 150 is formed. For example, the upper substrate 130 may include first edges 130E1 opposing each other in the first direction (the X-direction) and second edges 130E2 opposing each other in the second direction (the Y-direction), intersecting the first direction (the X-direction) and may include the first step structures 135 extending (e.g., extending lengthwise) in the second direction (the Y-direction) below the lower surface 130L adjacent to the first edges 130E1. An item, layer, or portion of an item or layer described as extending "lengthwise" in a particular direction has a length in the particular direction and a width perpendicular to that direction, where the length is greater than the width. In this case, the lower surface 130L of the upper substrate 130 may have a first surface 130L1 on which the first step structures 135 are disposed (e.g., which overlaps the first step structures 135 from a plan view) and a second surface 130L2 on which the first step structures 135 are not disposed (e.g., which does not overlap the first step structures 135 from the plan view), and the channel region CN may correspond to at least a portion of the second surface 130L2. The first surface 130L1 and second surface 130L2 may together form a single planar surface. In addition, the second surface 130L2 may have or form a step with respect to the lower surface 135L of the first step structures 135 and may be at a higher level. A height H3 of the step may be in the range of about 10 μm to about 20 μm. When the height H3 of the step is less than about 10 μm, the effect of reducing the joint pitch and ball size may be insignificant, and when the height H3 of the step exceeds about 20 μm, flowability of the encapsulant 150 may be inhibited or warpage control may be difficult. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In the present example embodiment, the step structures 135 may be formed by patterning the first and second solder resist layers SR1 and SR2 sequentially stacked at the bottom of the upper substrate 130. The first solder resist layer SR1 may provide a second protective layer 134 disposed below the insulating layer 131 of the upper substrate 130. The second solder resist layer SR2 may provide step structures 135 disposed below the second protective layer 134. For example, the upper substrate 130 may include an insulating layer 131 on which the upper wiring layer 132 is disposed, and a first solder resist layer SR1 disposed below the insulating layer 131 and providing the lower surface 130L of the upper substrate 130. The second solder resist layer SR2 may be disposed below the first solder resist layer SR1 to provide the first step structures 135. In this case, the channel region CN may have a trench form crossing the lower surface 130L of the upper substrate 130 to separate the second solder resist layer SR2 into the step structures 135, which are spaced apart from each other. The channel region CN exposes the first solder resist layer SR1 between the step structures 135.

Also, the channel region CN may extend in a direction and at a location in which the connection structures 140 are arranged at wide intervals. For example, the channel region CN may include sub-regions that pass between the second connection structures 140B arranged at a wider interval than an interval between the second connection structures 140B and the first connection structures 140A and wider than an interval between the first connection structures 140A, to extend to the second edges 130E2.

The connection structure 140 may be disposed between the lower substrate 110 and the upper substrate 130 to electrically connect the lower wiring layer 112 and the upper wiring layer 132. The connection structure 140 may be disposed between the lower substrate 110 and the upper substrate 130 to provide a vertical connection path electrically connecting the lower wiring layer 112 to the upper wiring layer 132. The connection structure 140 may include structures having a spherical or ball shape formed of a low-melting-point metal, such as tin (Sn), indium (In), bismuth (Bi), antimony (Sb), copper (Cu), silver (Ag), zinc (Zn), lead (Pb), or alloys (e.g., Sn-AG-Cu) thereof. Each structure, or connector, may be described as a solder structure, or a reflowed connector.

The connection structure 140 may include first connection structures 140A (also described as first connectors) and second connection structures 140B (also described as second connectors) disposed collectively around the semiconductor chip 120. The first connection structures 140A may be aligned in rows respectively adjacent to the first edges 130E1, and the second connection structures 140B may be aligned in rows respectively adjacent to the second edges 130E2. The first connection structures 140A may overlap the step structures 135, and the second connection structures 140B may not overlap the step structures 135. For example, the step structures 135 and the second protective layer 134 may have an opening h exposing at least a portion of the upper wiring layer 132, and the first connection structures 140A may be disposed below the step structures 135 and may be electrically connected to the upper wiring layer 132 through the opening h. In this case, the first connection structures 140A may include a contact portion 141 filling the opening h and a body portion 142 extending from the contact portion 141 to the upper surface of the lower substrate 110, and the body portion 142 may have a convex side shape to have a width greater than a width of the contact portion 141 in a horizontal direction (the X and Y directions). Similarly, the second connection structures 140B may include the contact portion 141 filling the opening h of the second protective layer 134 and the body portion extending from the contact portion 141 to the upper surface of the lower substrate 110.

The second connection structures 140B may be disposed to be adjacent to the second edges 130E2 from which the channel region CN extends. For smooth distribution of the flux cleaning solution and an encapsulating resin through the channel region CN, the second connection structures 140B may be arranged to be spaced apart from each other by a larger interval than that of the first connection structures 140A. For example, the first connection structures 140A may be arranged at a first interval sd1, and the second connection structures 140B may be arranged at a second interval sd2 greater than the first interval sd1. Here, the first interval sd1 may be in the range of about 100 μm to about 500 μm, and the second interval sd2 may be in the range of about 500 μm to about 1000 μm, but not limited thereto. For example, the second interval sd2 may be about 1.1 to about 3 times the first interval sd1, and in some between about 1.5 and about 2 times the first interval sd1. The second connection structures 140B may be a dummy structure electrically insulated from the first connection structures 140A. For example, the first connection structures 140A may be connected to a signal pattern, a ground pattern, and a power pattern of the lower wiring layer 112 and the upper wiring layer 132, and the second connection structures 140B may be connected to a dummy pattern insulated therefrom. According to an example embodiment, the second connection structures 140B may be connected to the ground pattern and the power pattern. Compared to the second connection structures 140B, the first connection structures 140A may have a thinner neck at a top, caused by the step structures 135, which neck, or neck portion, may have substantially straight and vertical sidewalls, rather than curved or angled sidewalls.

The encapsulant 150 may fill a space between the lower substrate 110 and the upper substrate 130 to encapsulate at least a portion of each of the semiconductor chip 120 and the connection structure 140. The encapsulant 150 may include or be formed of, for example, a thermosetting resin such as an epoxy resin, a thermoplastic resin such as polyimide, a prepreg including an inorganic filler and/or glass fiber, ABF, FR-4, BT, and EMC. The encapsulant 150 may have a molded underfill (MUF) structure integrally formed with an underfill resin between the semiconductor chip 120 and the lower substrate 110, but is not limited thereto. In some example embodiments, the encapsulant 150 may have a capillary underfill (CUF) structure in which the underfill resin below the semiconductor chip 120 is separated. As described above, impurities (e.g., flux residues) inside the step structures 135 may be smoothly removed through the channel region CN. Accordingly, impurities or voids may be prevented from being included in the encapsulant 150 and the quality and yield of the encapsulant 150 may be improved.

The connection bumps 160 may be disposed below the lower substrate 110 and may be electrically connected to the lower wiring layer 112. The connection bumps 160 may physically and/or electrically connect the semiconductor package 100A to an external device, and may therefore be described as external connection terminals, or package connection terminals. The connection bumps 160 may include or be formed of a conductive material and may have a ball, pin, or lead shape. For example, the connection bumps 160 may be solder balls. In an example, at least one passive element 170 disposed to be adjacent to the connection bumps 160 may be disposed below the lower substrate 110. The passive element 170 may include, for example, a capacitor such as a multilayer ceramic capacitor (MLCC) or a low inductance chip capacitor (LICC), an inductor, a bead, and the like. In an example embodiment, the passive element 170 may be a land-side capacitor (LSC). However, the present inventive concept is not limited thereto, and depending on the example embodiment, the passive element 170 may be a die-side capacitor (DSC) mounted on the upper surface of the lower substrate 110 or an embedded type capacitor embedded in the lower substrate 110.

Figure 2A:
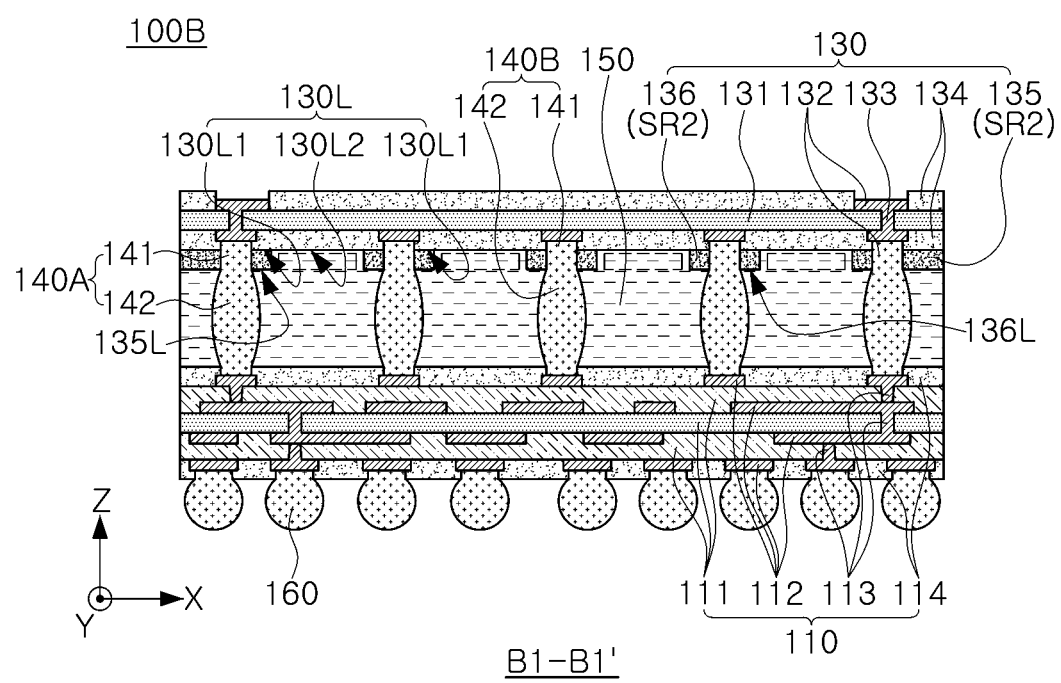
FIG. 2A is a cross-sectional view illustrating a semiconductor package according to an example embodiment of the present inventive concept.
Figure 2B:
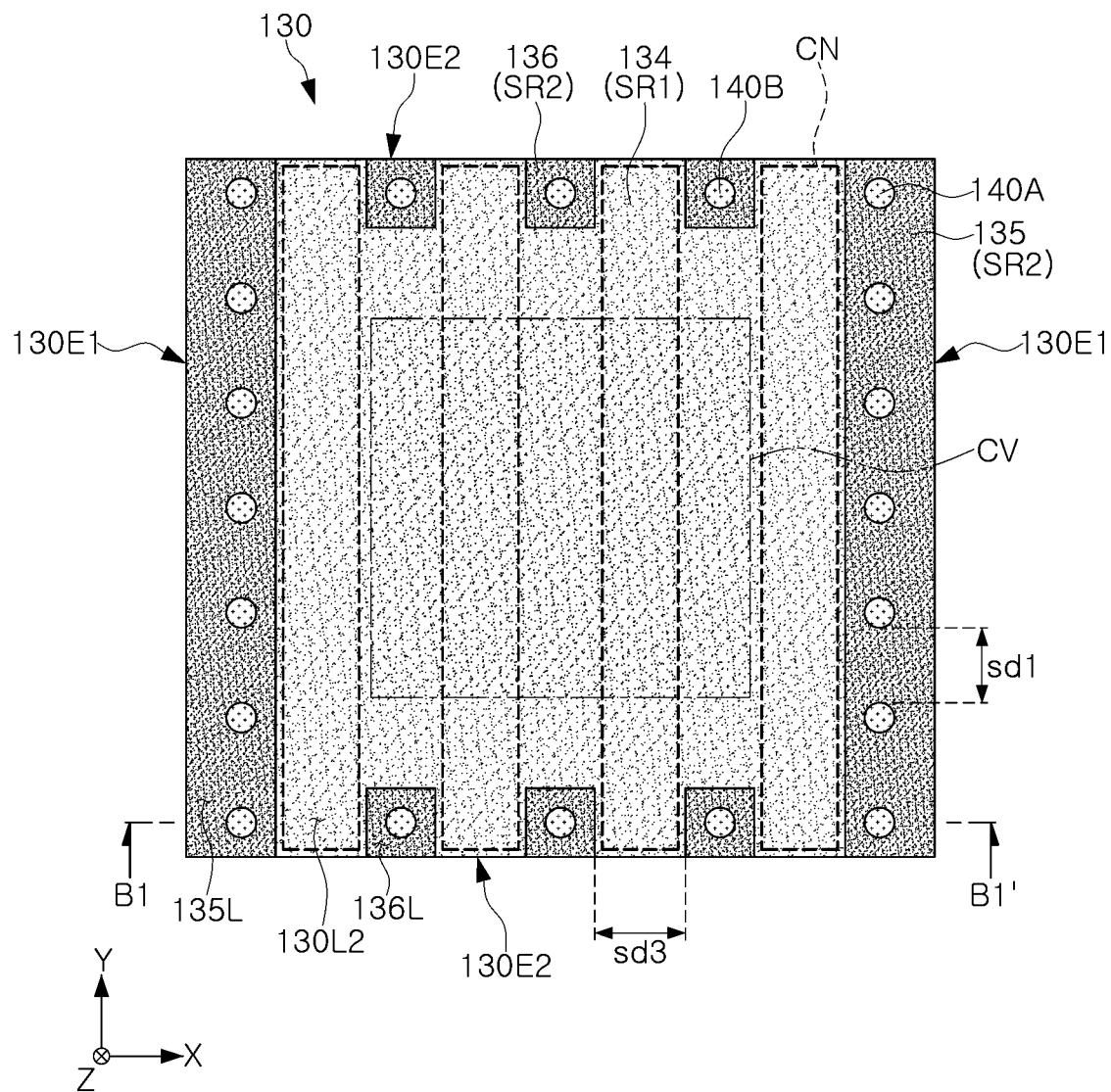
FIG. 2B is a bottom view illustrating an upper substrate of FIG. 2A.

FIG. 2A is a cross-sectional view illustrating a semiconductor package 100B according to an example embodiment of the present inventive concept, and FIG. 2B is a bottom view illustrating an upper substrate of FIG. 2A. FIG. 2B illustrates a bottom surface of the upper substrate 130 taken along the lower surface 135L of the first step structures 135, the lower surface 136L of the second step structures 136 and the second surface 130L2 of the upper substrate 130. FIG. 2A illustrates a cross-section of the upper substrate 130 corresponding to the line B1-B1' of FIG. 1B.

Referring to FIGS. 2A and 2B, the semiconductor package 100B according to an example embodiment may have characteristics that are the same as or similar to those described above with reference to FIGS. 1A to 1D, except that the second step structures 136 are further included. The upper substrate 130 of the present example embodiment may further include second step structures 136 disposed to be spaced apart from each other below the lower surface 130L adjacent to the second edges 130E2.

The second step structures 136 may protrude from the lower surface 130L of the upper substrate 130 and may be disposed to be adjacent to the second edges 130E2. The upper substrate 130 may have a channel region CN extending between the second edges 130E2 of the upper substrate 130 by passing between the second step structures 136. The channel region CN may include a plurality of channel regions CN passing between the second step structures 136.

For example, the upper substrate 130 may include first edges 130E1 opposing each other in the first direction (the X-direction) and second edges opposing each other in the second direction (the Y-direction), intersecting the first direction (the X-direction), and may include first step structures 135 extending in the second direction (the Y-direction) below the lower surface 130L adjacent to the first edges 130E1 and second step structures 136 spaced apart from each other in the first direction (the X-direction) below the lower surface 130L adjacent to the second edges 130E2. In this case, the lower surface 130L of the upper substrate 130 may have a first surface 130L1 on which the first step structures 135 and the second step structures 136 are disposed and a second surface 130L2 excluding the first surface 130L1, and the channel region CN may correspond to at least a portion of the second surface 130L2.

In the present example embodiment, the second step structures 136 may be formed by patterning the second solder resist layers SR2 stacked on the lower side of the upper substrate 130. The channel region CN may cross the lower surface 130L of the upper substrate 130 to separate the second solder resist layer SR2 into first step structures 135 and second step structures 136 spaced apart from each other and expose the first solder resist layer SR1 therebetween. the lower surface 136L of the second step structures 136 may be substantially on the same level as that of the lower surface 135L of the first step structures 135.

The second connection structures 140B may be disposed below the second step structures 136. For smooth distribution of the flux cleaning solution and the encapsulating resin through the channel region CN, the second step structures 136 may be arranged to be spaced apart from each other by a larger interval than that of the first connection structures 140A. For example, the first connection structures 140A may be arranged at a first interval sd1, and the second step structures 136 may be arranged at a third interval sd3 greater than the first interval sd1. Here, the first interval sd1 may be in the range of about 100 μm to about 500 μm, and the third interval sd3 may be in the range of about 500 μm to about 1000 μm, but these are not limited thereto.

Figure 3A:
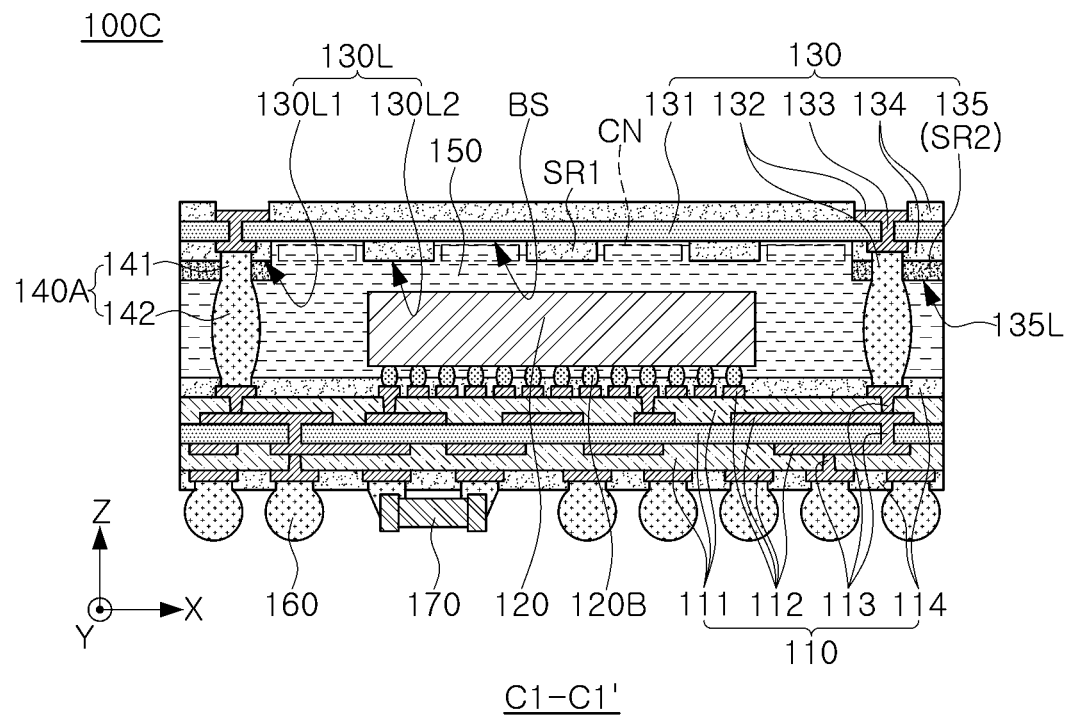
FIGS. 3A to 3C are cross-sectional views illustrating a semiconductor package according to an example embodiment of the present inventive concept.
Figure 3B:
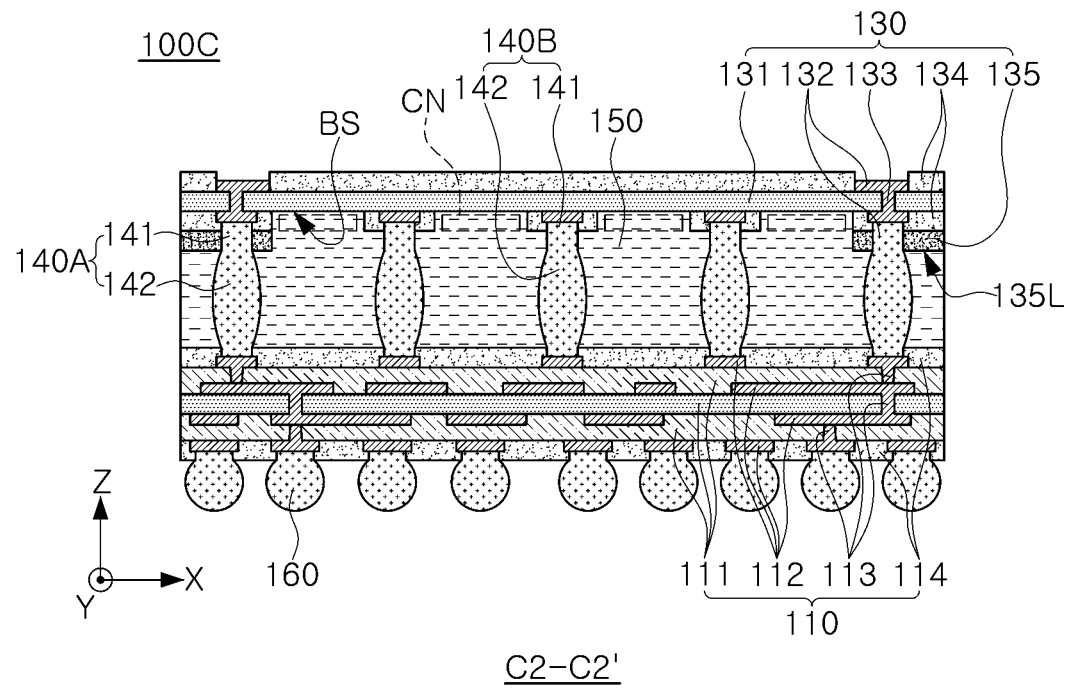
Figure 3C:
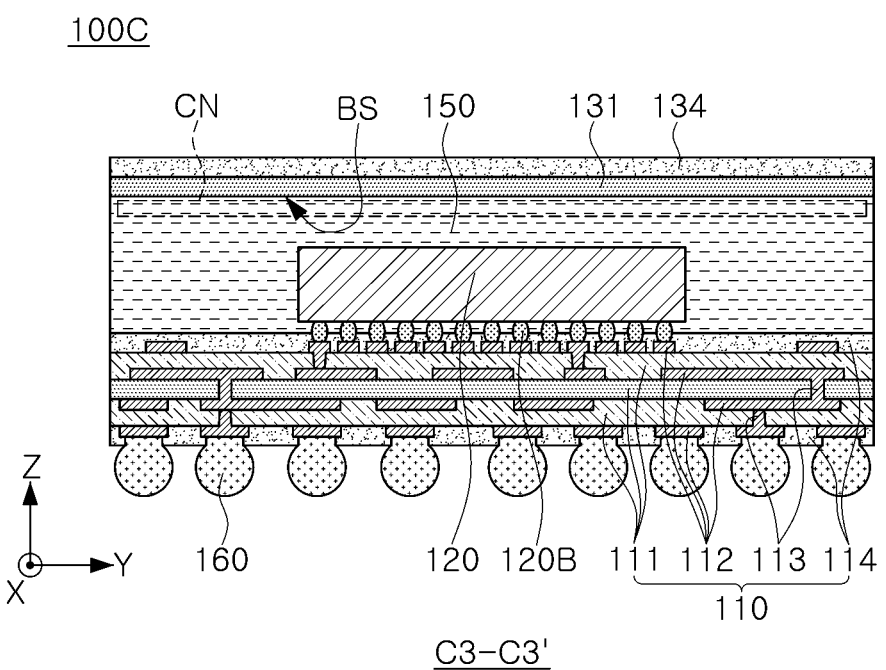
Figure 3D:
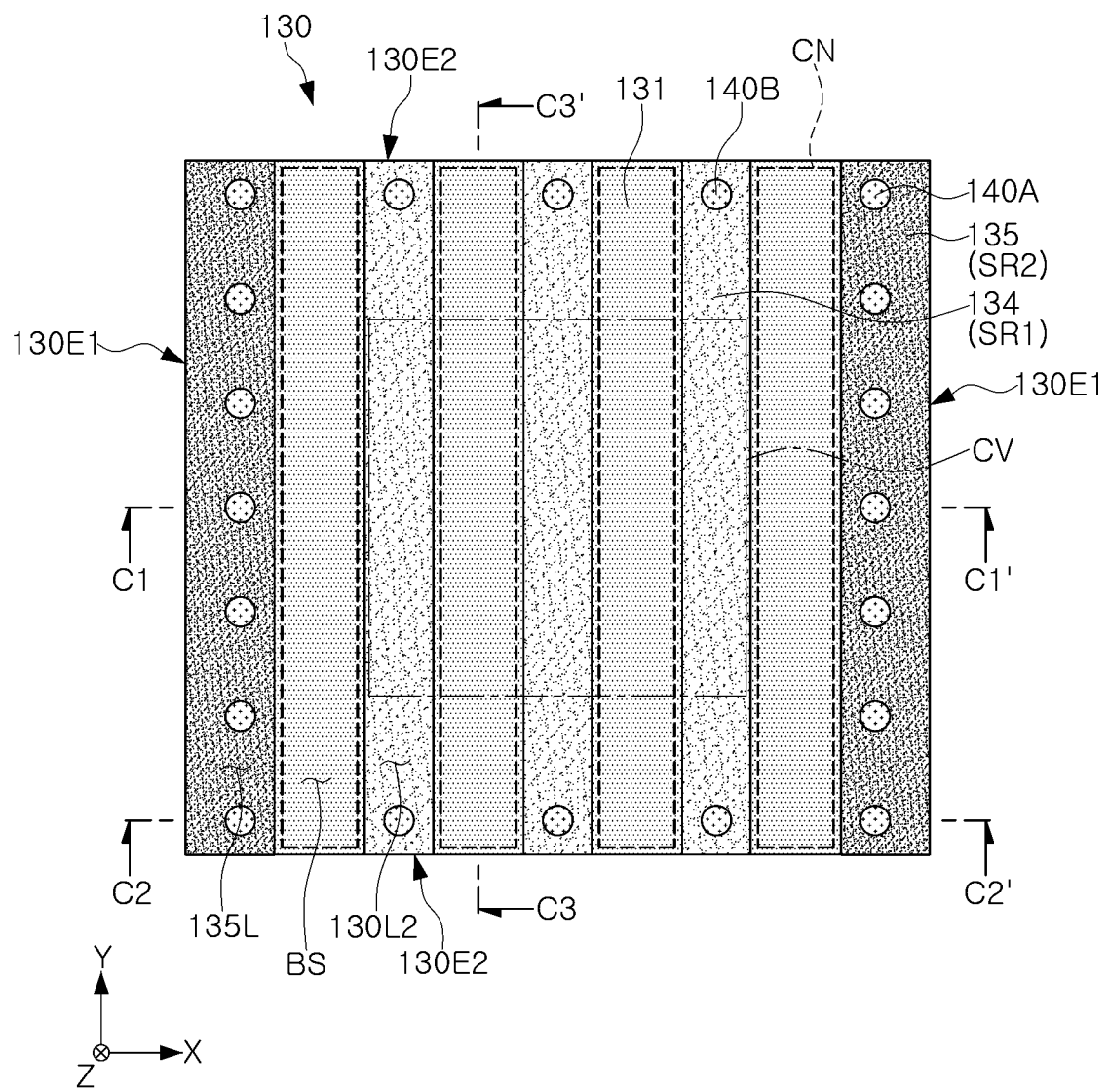
FIG. 3D is a bottom view illustrating an upper substrate of FIGS. 3A to 3C.

FIGS. 3A to 3C are cross-sectional views illustrating a semiconductor package 100C according to an example embodiment of the present inventive concept, and FIG. 3D is a bottom view illustrating the upper substrate 130 of FIGS. 3A to 3C. FIG. 3D illustrates a bottom surface of the upper substrate 130 taken along the lower surface 135L of the step structures 135 and the second surface 130L2 of the upper substrate 130 in order to understand the arrangement relationship between the cavity region CV and the channel region CN. FIGS. 3A, 3B, and 3C illustrate cross-sections of the upper substrate 130 corresponding to lines C1-C1', C2-C2', and C3-C3' of FIG. 3D, respectively.

Referring to FIGS. 3A to 3D, the semiconductor package 100C according to an example embodiment may have characteristics that are the same as or similar to those described above with reference to FIGS. 1A to 2B, except that a bottom surface BS of the channel region CN is at a level higher than that of the lower surface 130L or the second surface 130L2 of the upper substrate 130. The channel region CN of the present example embodiment may have a layer height higher than that of the second surface 130L2 in the vertical direction (the Z-direction) in order to further improve the flux cleaning effect and the filling properties of the encapsulant 150. For example, the bottom surface BS of the channel region CN (e.g., a bottom surface of the upper substrate where the channel regions CN are located) may be located at a level higher than that of the lower surface 135L of the step structures 135 and the second surface 130L2 of the upper substrate 130.

In the present example embodiment, the step structures 135 may be formed by patterning the first and second solder resist layers SR1 and SR2 sequentially stacked below the upper substrate 130. For example, the upper substrate 130 may include an insulating layer 131 on which the upper wiring layer 132 is disposed, a first solder resist layer SR1 disposed below the insulating layer 131 and providing the lower surface 130L of the upper substrate 130, and a second solder resist layer SR2 disposed below the first solder resist layer SR1 and providing the first step structures 135. In this case, the channel region CN may have a trench form crossing the lower surface 130L of the upper substrate 130 to separate the second solder resist layer SR2 into step structures 135 spaced apart from each other, and furthermore, passing through the first solder resist layer SR1 to expose the insulating layer 131.

Figure 4A:
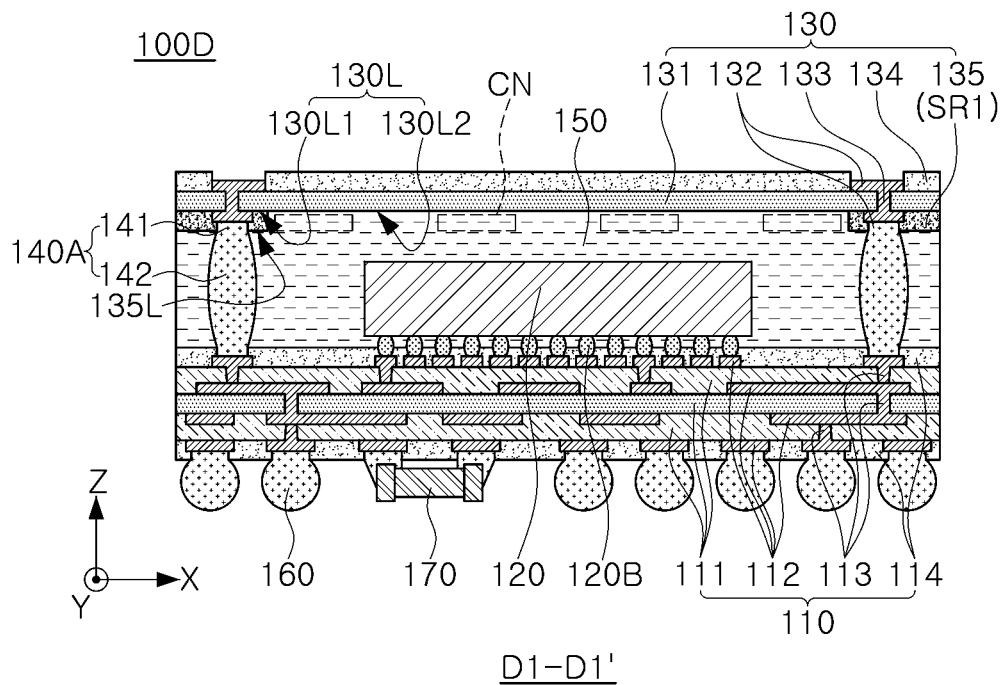
FIGS. 4A and 4B are cross-sectional views illustrating a semiconductor package according to an example embodiment of the present inventive concept.
Figure 4B:
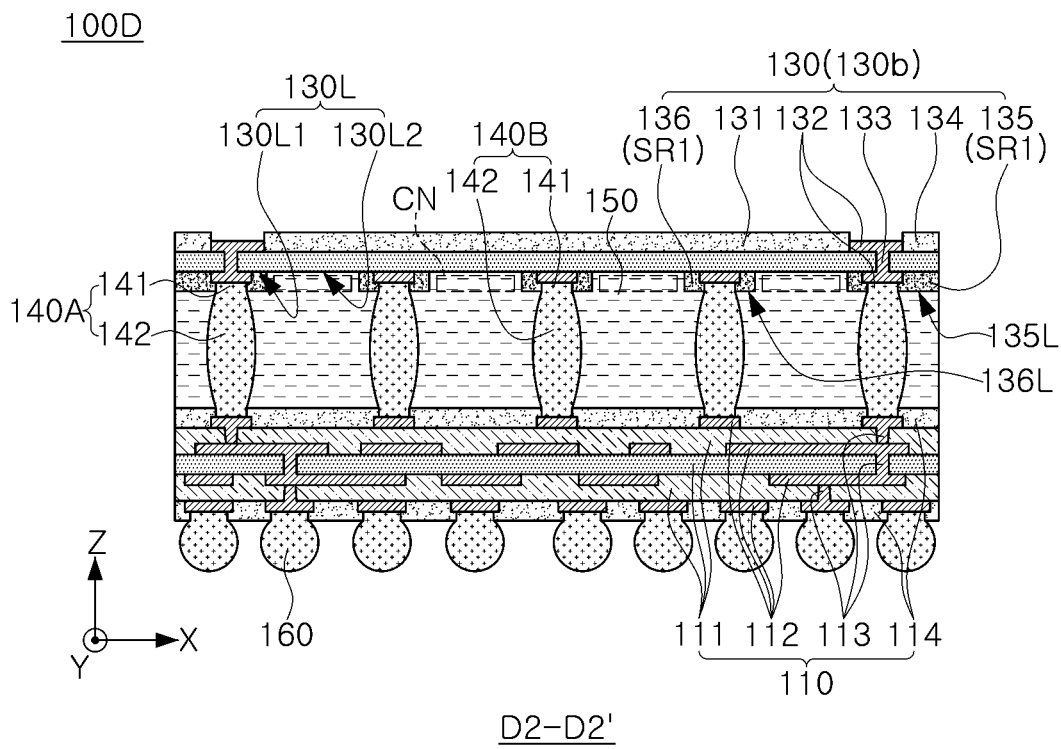
Figure 4C:
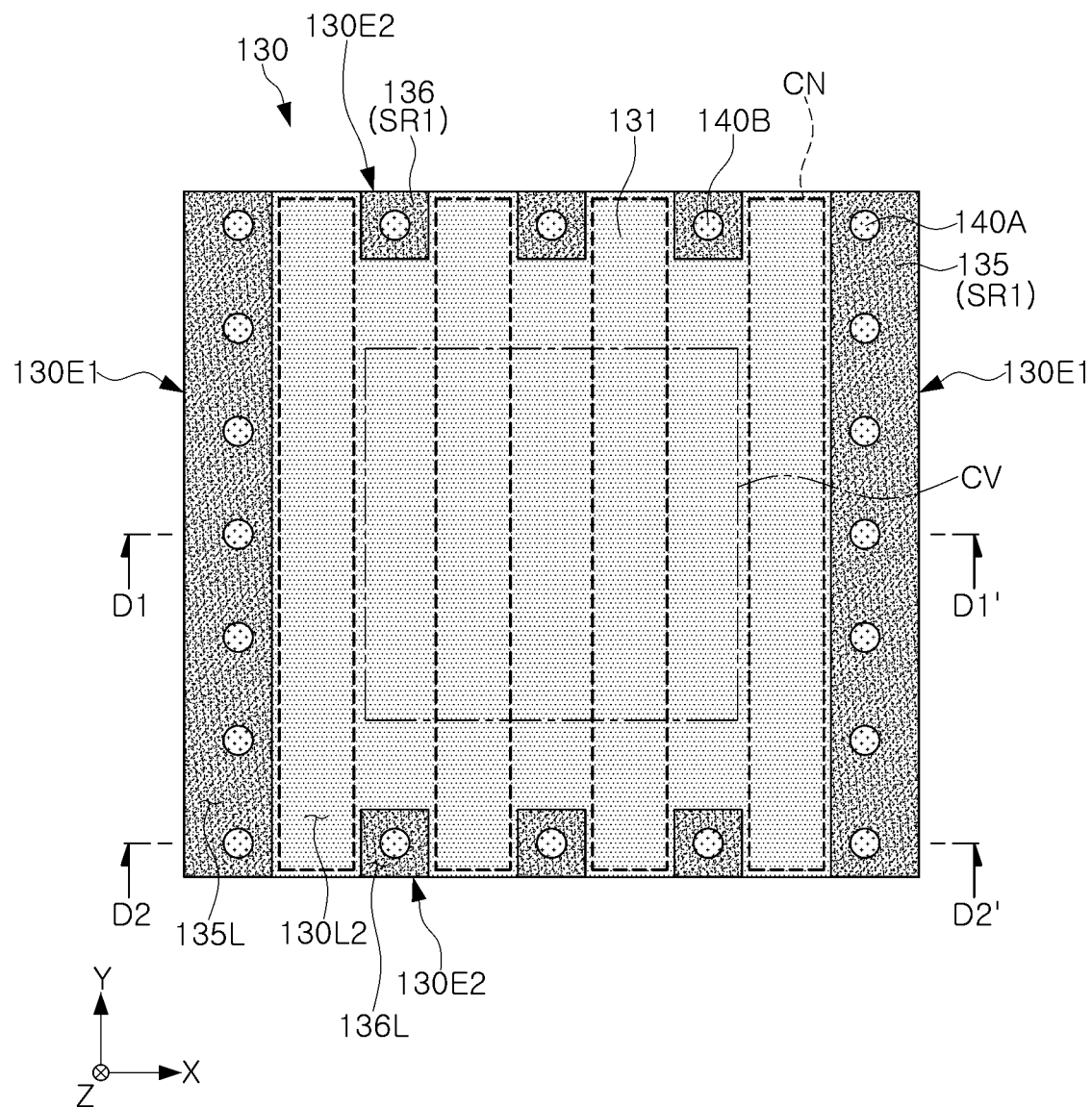
FIG. 4C is a bottom view illustrating an upper substrate of FIGS. 4A and 4B.

FIGS. 4A and 4B are cross-sectional views illustrating a semiconductor package 100D according to an example embodiment of the present inventive concept, and FIG. 4C is a bottom view illustrating the upper substrate 130 of FIGS. 4A and 4B. FIG. 4C illustrates a bottom surface of the upper substrate 130 taken along the lower surface 135L of the step structures 135 and the second surface 130L2 of the upper substrate 130. FIGS. 4A and 4B illustrate cross-sections of the upper substrate 130 corresponding to lines D1-D1' and D2-D2' of FIG. 4C, respectively.

Referring to FIGS. 4A to 4C, the semiconductor package 100D according to an example embodiment has characteristics that are the same as or similar to those described above with reference to FIGS. 1A to 3D, except that the first solder resist layer SR1 is formed as a single layer below the upper substrate 130. Since the height of the upper substrate 130 of the present example embodiment is reduced, compared to the example embodiments described above, the height of the semiconductor package 100D may be further reduced. The upper substrate 130 of the present example embodiment may include the insulating layer 131 on which the upper wiring layer 132 is disposed and the first solder resist layer SR1 disposed below the insulating layer 131 and providing the first step structures 135 and/or the second step structures. Here, the lower surface 130L of the upper substrate 130 may be provided by the insulating layer 131.

In the present example embodiment, the first step structures 135 and the second step structures 136 may be formed by patterning the first solder resist layers SR1 stacked below the upper substrate 130. For example, the upper substrate 130 may include the insulating layer 131 providing the lower surface 130L of the upper substrate 130 and the first solder resist layer SR1 disposed below the insulating layer 131 and providing the first step structures 135 and the second step structures 136. In this case, the channel region CN may cross the lower surface 130L of the upper substrate 130 to separate the first solder resist layer SR1 into the first step structures 135 and the second step structures 136 spaced apart from each other and expose the insulating layer 131 therebetween.

Figure 5A:
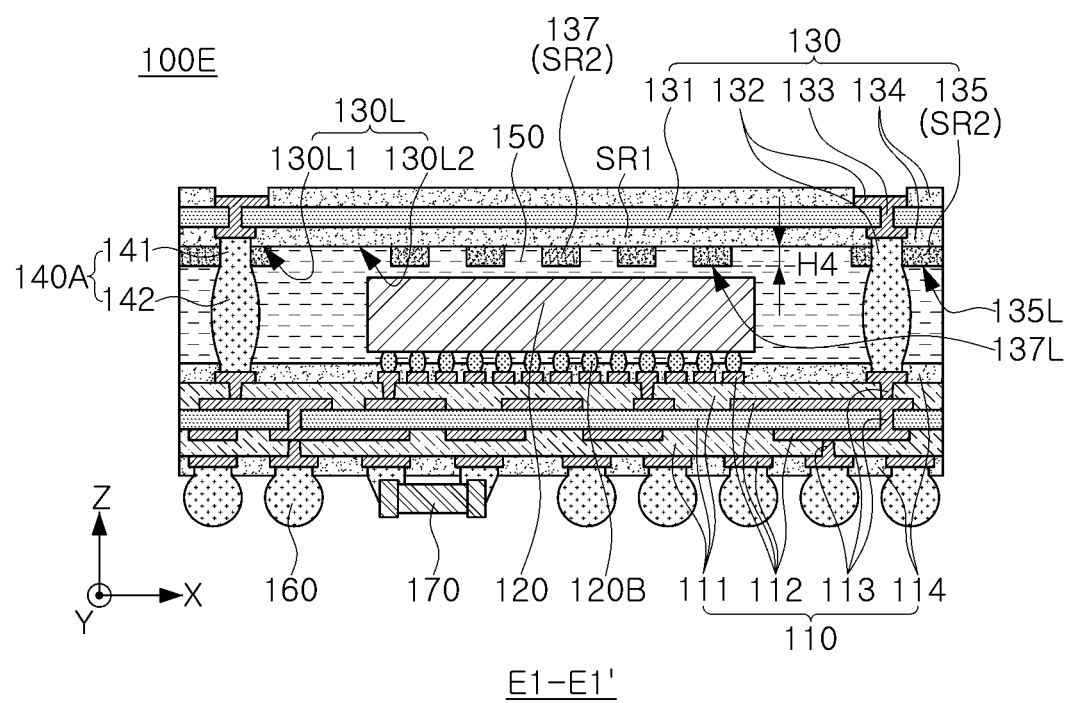
FIG. 5A is a cross-sectional view illustrating a semiconductor package according to an example embodiment of the present inventive concept.
Figure 5B:
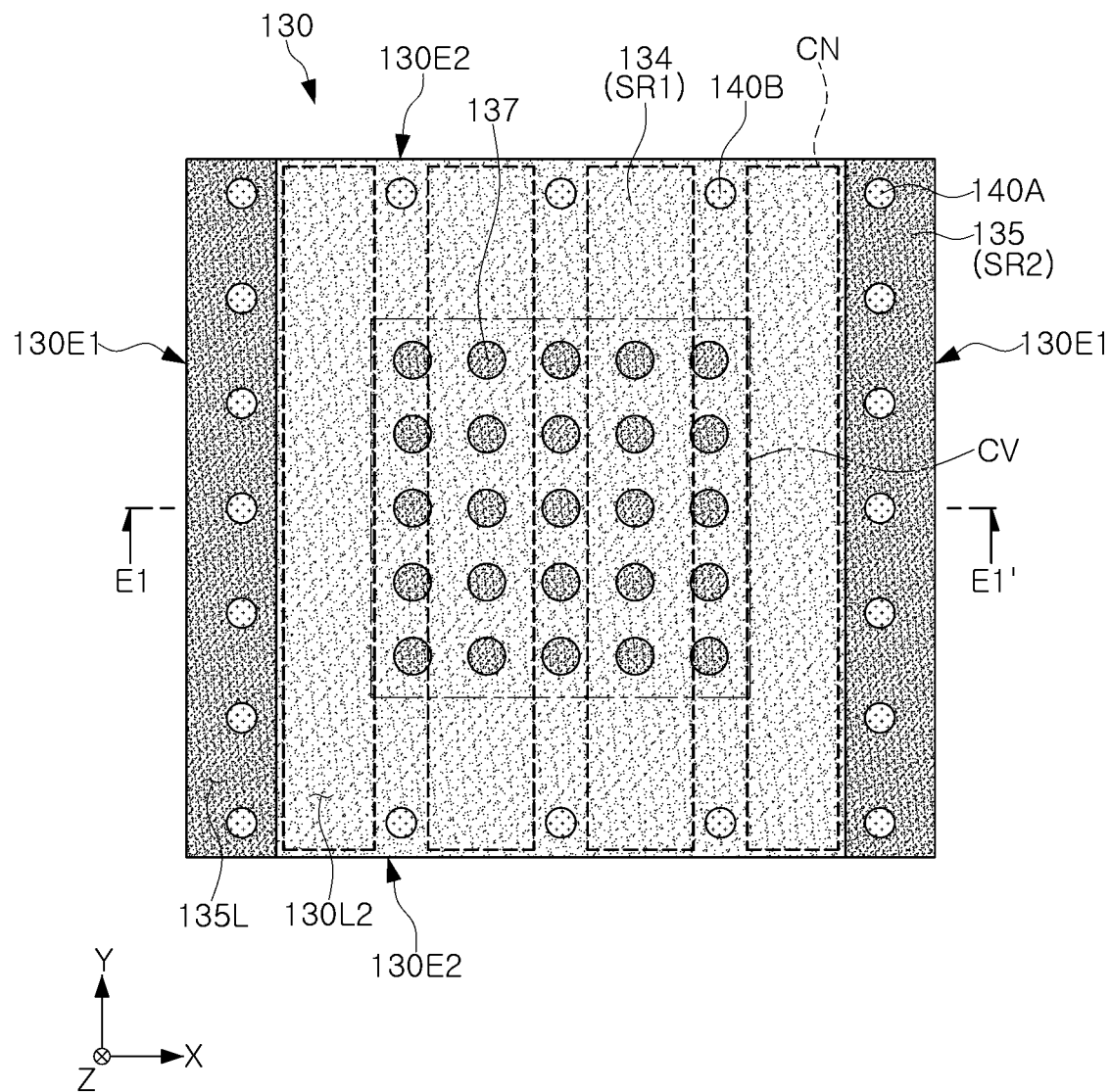
FIG. 5B is a bottom view illustrating an upper substrate of FIG. 5A.

FIG. 5A is a cross-sectional view illustrating a semiconductor package 100E according to an example embodiment of the present inventive concept, and FIG. 5B is a bottom view illustrating the upper substrate 130 of FIG. 5A. FIG. 5B illustrates a bottom surface of the upper substrate 130 taken along a lower surface 135L of the step structures 135, a second surface 130L2 of the upper substrate 130, and a lower surface 137L of a plurality of patch structures 137 to understand the arrangement relationship of the plurality of patch structures 137. FIG. 5A illustrates a cross-section of the upper substrate 130 corresponding to line E1-E1' of FIG. 5B.

Referring to FIGS. 5A and 5B, the semiconductor package 100E according to an example embodiment may have characteristics that are the same as or similar to those described above with reference to FIGS. 1A to 4, except that the plurality of patch structures 136 are further provided on the lower surface 130L of the upper substrate 130. The upper substrate 130 of the present example embodiment may further include the plurality of patch structures 137 arranged on the lower surface 130L or the cavity region CV to overlap the semiconductor chip 120.

The plurality of patch structures 137 may control warpage of the upper substrate 130. For example, when the upper substrate 130 is excessively bent during a manufacturing process of the semiconductor package 100E, the plurality of patch structures 137 may come into contact with the upper surface of the semiconductor chip 120 to support the upper substrate 130, thereby controlling warpage of the upper substrate 130 and reducing a non-wet risk of the connection structure 140. The plurality of patch structures 137 may be formed in the same stage as that of the step structures 135. For example, when the step structures 135 are formed by patterning the second solder resist layer SR2, the plurality of patch structures 137 may also be formed by patterning the second solder resist layer SR2. Accordingly, the plurality of patch structures 137 may have substantially the same height H4 as the step structures 135, but they are not limited thereto.

Figure 6A:
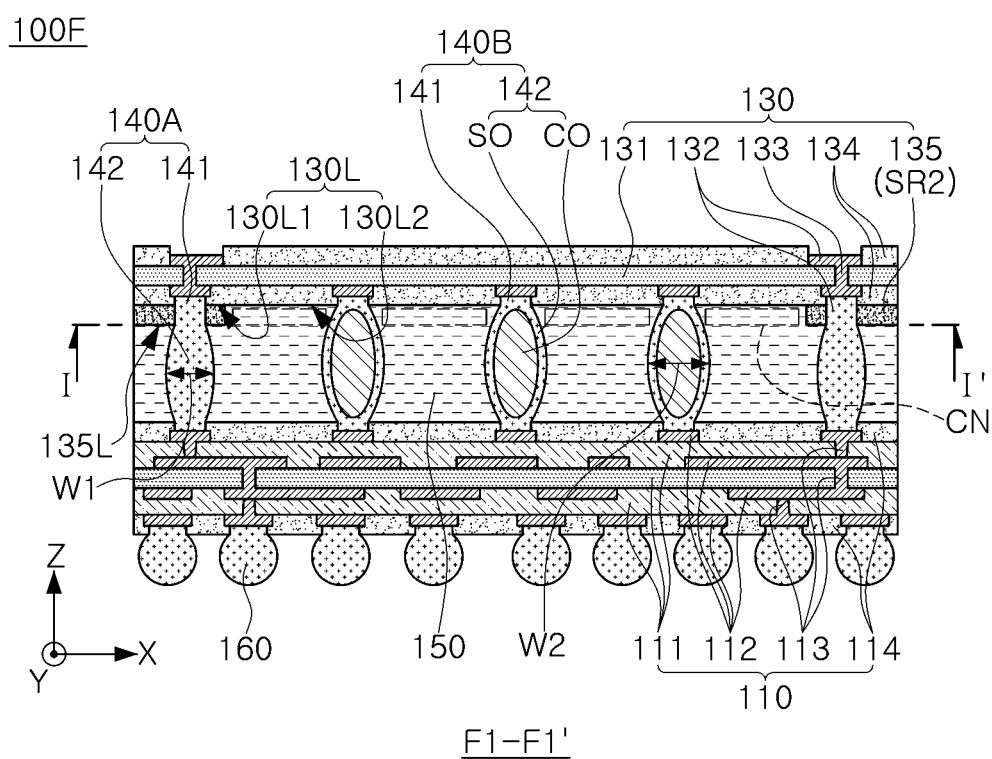
FIG. 6A is a cross-sectional view illustrating a semiconductor package according to an example embodiment of the present inventive concept.
Figure 6B:
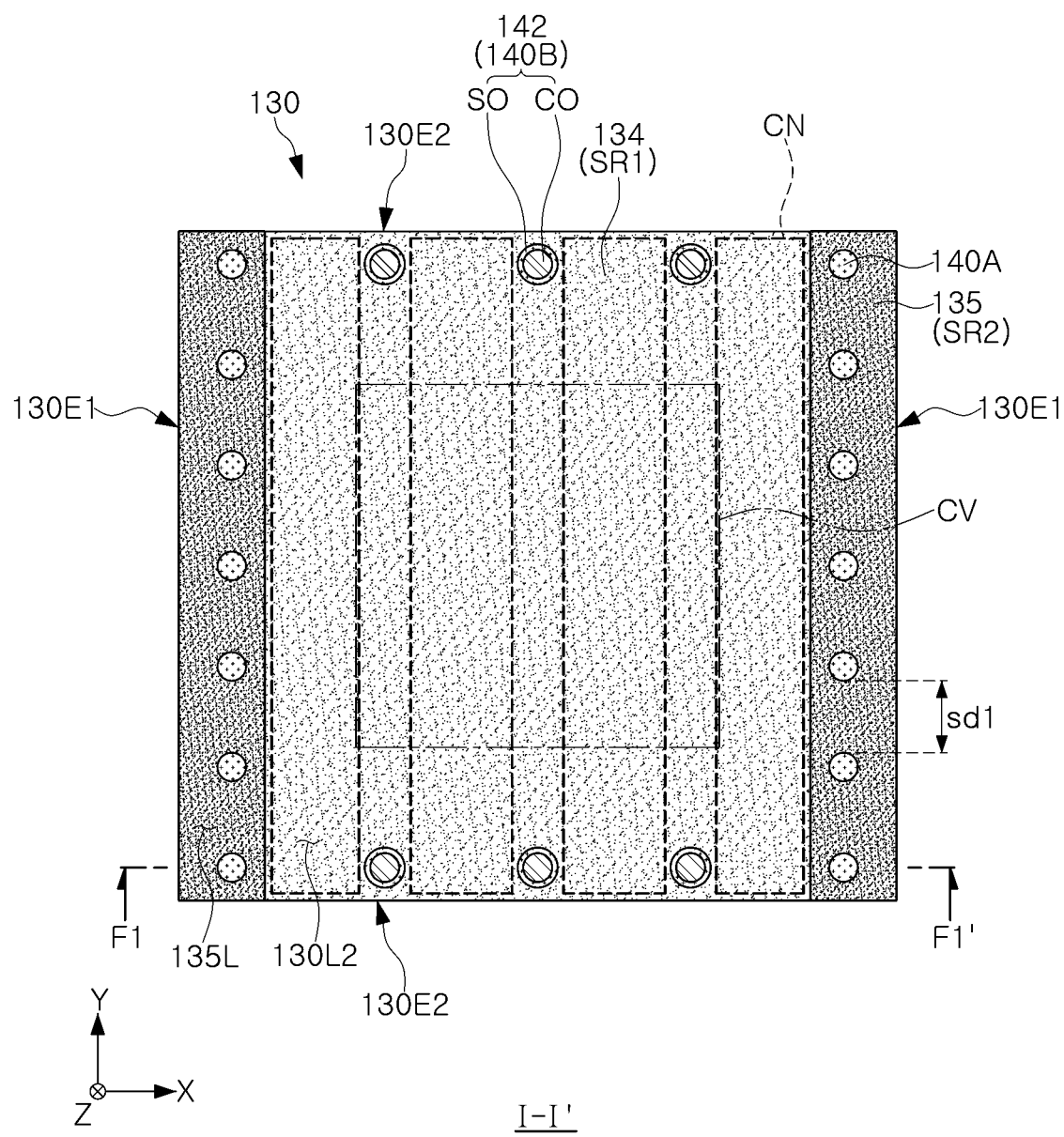
FIG. 6B is a bottom view illustrating an upper substrate of FIG. 6A.

FIG. 6A is a cross-sectional view illustrating a semiconductor package 100F according to an example embodiment of the present inventive concept, and FIG. 6B is a bottom view illustrating the upper substrate 130 of FIG. 6A. FIG. 6B illustrates the bottom surface of the upper substrate 130 along line I-I' of FIG. 6A. FIG. 6A illustrates a cross-section of the upper substrate 130 corresponding to the line F1-F1' of FIG. 6B.

Referring to FIGS. 6A and 6B, the semiconductor package 100F according to an example embodiment has characteristics that are the same as or similar to those described above with reference to FIGS. 1A to 5B, except that a body portion 142 of second connection structures 140B includes a core CO and a solder layer SO covering a surface of the core CO. The second connection structures 140B of the present example embodiment may have a core ball structure in which the core CO is buried in the solder layer SO. The core CO may include or be formed of a polymer material including a thermoplastic resin, a thermosetting resin, or a metal material distinct from solder. The solder layer SO may include or be formed of tin (Sn) or an alloy including tin (Sn). The second connection structures 140B may have a width W2 greater than the width W1 of the first connection structures 140A. In some example embodiments, the first connection structures 140A may also have a core ball structure in consideration of the first interval sd1 between the first connection structures 140A.

Figure 7:
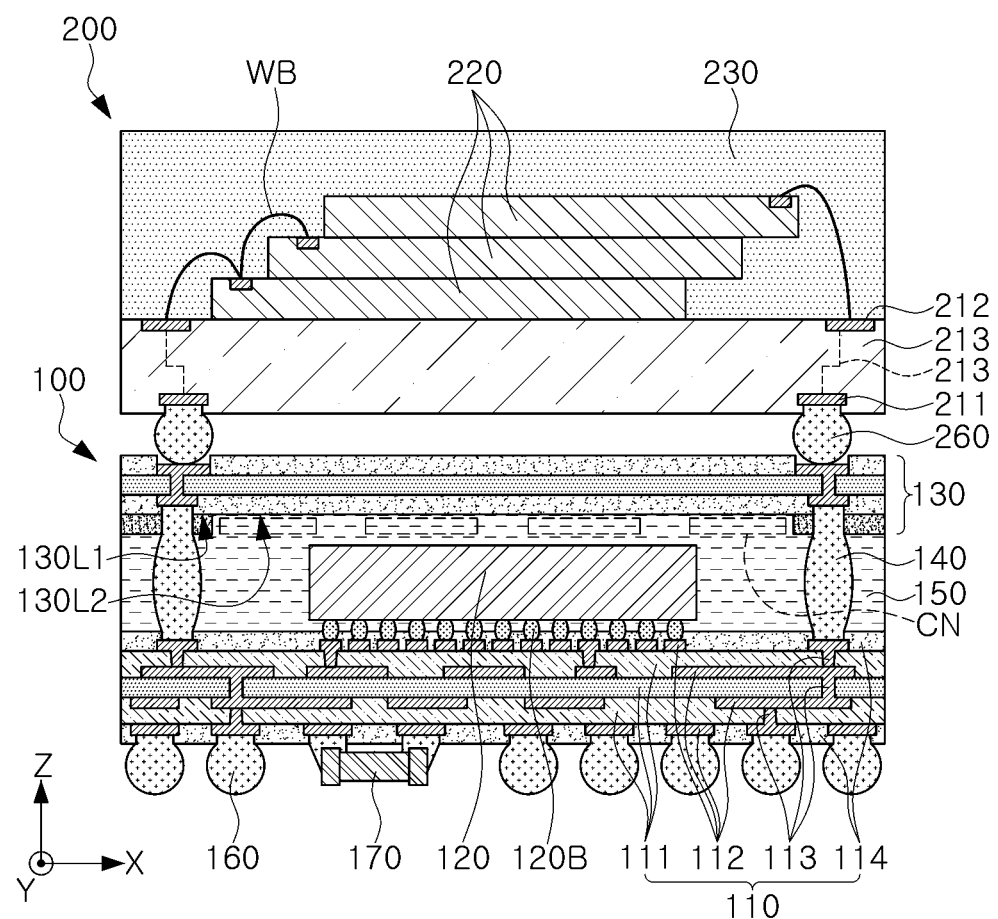
FIG. 7 is a cross-sectional view illustrating a semiconductor package according to an example embodiment of the present inventive concept.

FIG. 7 is a cross-sectional view illustrating a semiconductor package 1000 according to an example embodiment of the present inventive concept.

Referring to FIG. 7, the semiconductor package 1000 according to an example embodiment may include a first package 100 and a second package 200. The first package 100 is illustrated to be the same as the semiconductor package 100A illustrated in FIG. 1A, but may be understood as having characteristics that are the same as or similar to the semiconductor packages 100A, 100B, 100C, 100D, 100E, and 10F described above with reference to FIGS. 1 to 6.

The second package 200 may include a redistribution substrate 210, a second semiconductor chip stack including a plurality of second semiconductor chips 220, and a second encapsulant 230. The redistribution substrate 210 may include a lower pad 211 and an upper pad 212 on the lower surface and the upper surface, respectively, that may be electrically connected to the outside. Also, the redistribution substrate 210 may include a redistribution circuit 213 electrically connecting the lower pad 211 and the upper pad 212 to each other.

The second semiconductor chips 220 may be mounted on the redistribution substrate 210 by wire bonding or flip-chip bonding. For example, the plurality of second semiconductor chips 220 may be vertically stacked on the redistribution substrate 210 and may be electrically connected to the upper pad 212 of the redistribution substrate 210 by a bonding wire WB. In an example, the second semiconductor chips 220 may include memory chips, and the first semiconductor chip 120 may include an AP chip.

The second encapsulant 230 may include or may be formed of a material that is the same as or similar to that of the encapsulant 150 of the first package 100. The second package 200 may be physically and electrically connected to the first package 100 by the conductive bumps 260. The conductive bumps 260 may be electrically connected to the redistribution circuit 213 inside the redistribution substrate 210 through the lower pad 211 of the redistribution substrate 210. The metal bump 260 may include or be formed of a low melting point metal, for example, tin (Sn) or an alloy including tin (Sn).

The semiconductor package 1000 according to an example embodiment may include the first package 100 having an excellent filling state of the encapsulant 150 and having a reduced thickness. Therefore, according to an example embodiment of the present inventive concept, a package-on-package structure having a reduced thickness and excellent reliability may be implemented.

Hereinafter, a manufacturing process of a semiconductor package according to an example embodiment of the present inventive concept will be described with reference to FIGS. 8A to 8D and 9A to 9C, focusing on a manufacturing process of the upper substrate 130 and the connection structure 140.

FIGS. 8A to 8D are cross-sectional views illustrating a manufacturing process of the upper substrate 130 illustrated in FIG. 1B.

Figure 8A:
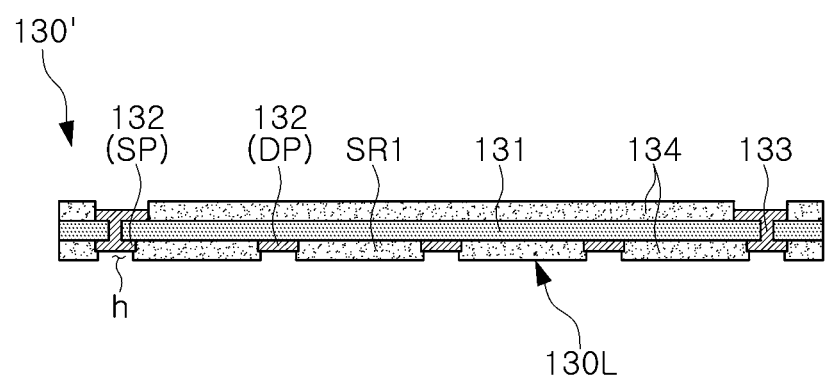
FIGS. 8A to 8D are cross-sectional views illustrating a manufacturing process of an upper substrate shown in FIG. 1B.

Referring to FIG. 8A, first, a preliminary upper substrate 130' on which an insulating layer 131, an upper wiring layer 132, a wiring via 133, and a second protective layer 134 are formed is prepared. The upper wiring layer 132 and the wiring via 133 may be formed on surfaces (e.g., upper, lower, and side surfaces) of the insulating layer 131 using a photolithography process, a plating process, an etching process, or the like. For example, the insulating layer 131 may be a copper clad laminate. Although not shown in the drawings, a larger number of upper wiring layers may be formed by stacking additional insulating layers on surfaces of the insulating layer 131 according to an example embodiment. The second protective layer 134 (e.g., each of two separate layers, one above and one below the insulating layer 131) may be formed to have an opening h exposing a portion of the upper wiring layer 132 by applying a solder resist ink (e.g., PSR ink) and performing an exposure process and a development process. The upper wiring layer 132 may include a first pad SP and a second pad DP exposed through respective openings h. For example, the first pad SP may be a signal pad connected to the signal pattern, and the second pad DP may be a dummy pad insulated from the signal pattern and not connected (e.g., electrically or physically) to any circuit components of the upper substrate 130. The preliminary upper substrate 130' may have a lower surface 130L provided by the second protective layer 134 (e.g., by a bottom layer of the second protective layer 134). The second protective layer 134 may be formed, for example, of a prepreg material, ABF (Ajinomoto Build-up Film), FR-4, BT (e.g., bismaleimide triazine epoxy), or PSR.

Figure 8B:
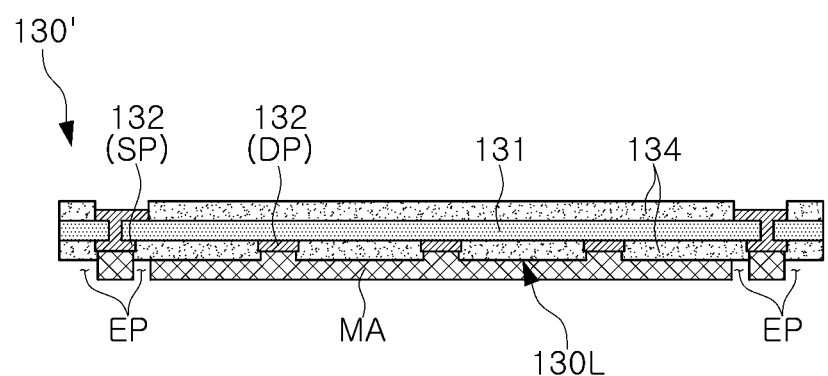

Referring to FIG. 8B, a patterned mask layer MA may be formed on the lower surface 130L of the preliminary upper substrate 130'. The mask layer MA may include an etch pattern EP adjacent to edges of the preliminary upper substrate 130'. The mask layer MA may include or be formed of a thermosetting resin, a UV curable resin, or a composite curable resin. Thereafter, the etching pattern EP of the mask layer MA may be filled with solder resist ink to form a second solder resist layer or step structures (refer to FIG. 8C).

Figure 8C:
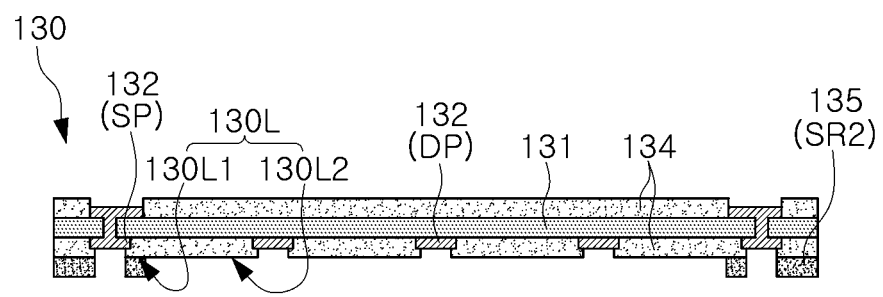

Referring to FIG. 8C, the upper substrate 130 on which the second solder resist layer SR2 is formed may be manufactured by filling the etch pattern ('EP' in FIG. 8B) with solder resist ink and removing the mask layer ('MA' in FIG. 8B). The second solder resist layer SR2 may be formed by applying solder resist ink including or formed of an epoxy-based, melamine-based, or imidazole-based resin. The second solder resist layer SR2 may be formed to provide step structures 135 corresponding to the etch pattern EP of FIG. 8B. Accordingly, the second solder resist layer SR2 or the protrusion structure 135 may have an opening (e.g., a plurality of openings) corresponding to an opening h (e.g., plurality of openings) of the second protective layer 134 and corresponding to a group of isolated pieces of the mask layer MA. The lower surface 130L of the upper substrate 130 may have a first surface 130L1 on which the step structures 135 are disposed and a second surface 130L2 excluding the step structures 135. The first surface 130L1 may be described as a first lower surface portion, section, or region, and the second surface 130L2 may be described as a second lower surface portion, section, or region. The step structures 135 may protrude below the lower surface 130L of the upper substrate 130 to reduce a joint pitch with the lower substrate (110' in FIG. 9A) in a process to be described later. According to an example embodiment, the second solder resist layer SR2 may be formed using a PSR (e.g., photo solder resist). In this case, the second solder resist layer SR2 may be formed by applying the PSR ink to the entire lower surface 130L of the lower substrate 130 and then performing an exposure process and a development process.

Figure 8D:
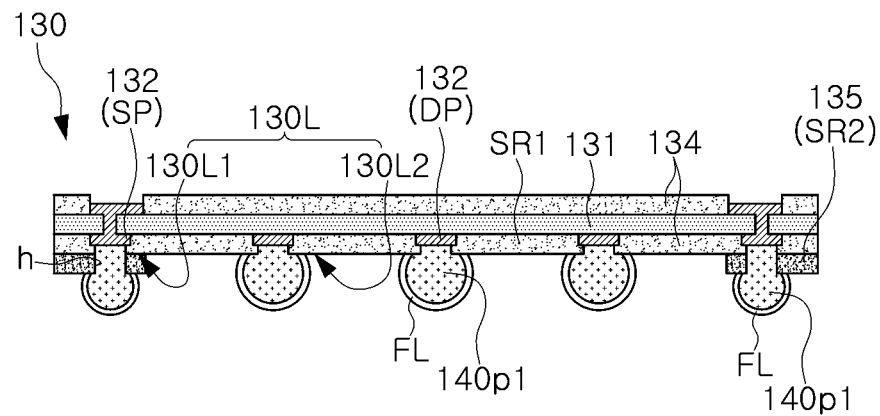

Referring to FIG. 8D, first preliminary connection structures 140p1 may be formed in the opening h of the first and second solder resist layers SR1 and SR2. The first preliminary connection structures 140p1 may be formed by applying a solder paste containing tin (Sn) or an alloy containing tin (Sn). After the first preliminary connection structures 140*p*1 are formed, a flux layer FL may be formed. The flux layer FL may be formed by applying a liquid or gel-type base material capable of reducing metal oxide to the surfaces of the first preliminary connection structures 140*p*1, but is not limited thereto, and the flux layer FL may be formed in the first preliminary connection structures 140*p*1. The flux layer FL may prevent oxidation of the solder in a subsequent reflow process and improve wettability and spreadability.

Figure 9A:
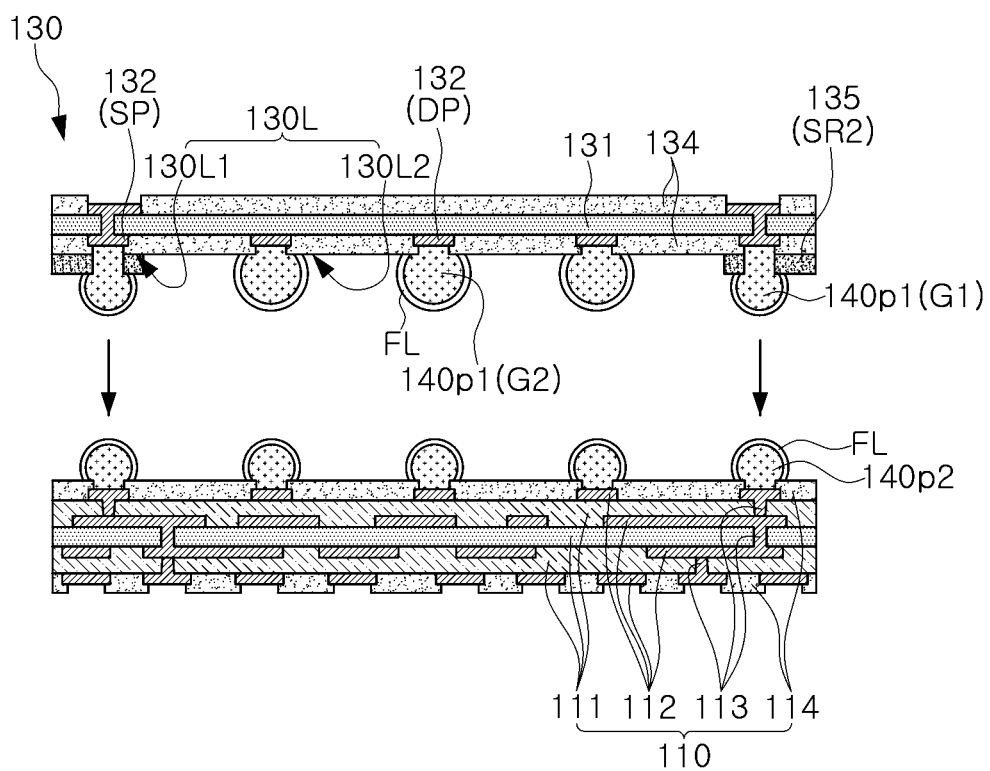
FIGS. 9A to 9C are cross-sectional views illustrating a manufacturing process of the semiconductor package illustrated in FIG. 1B.
Figure 9B:
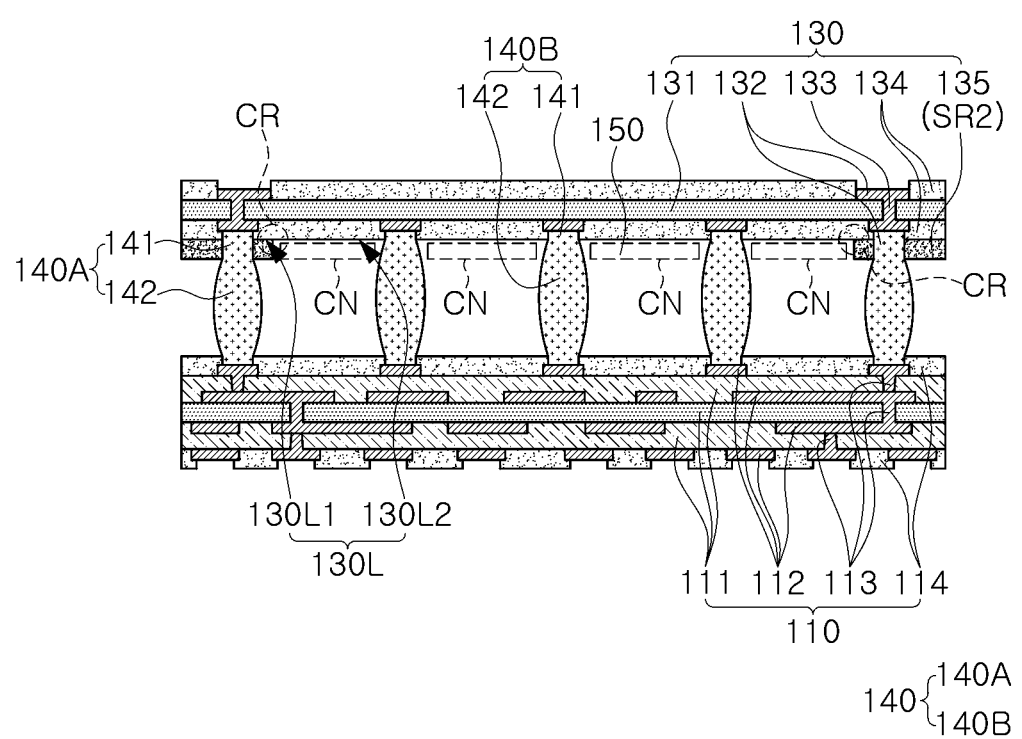
Figure 9C:
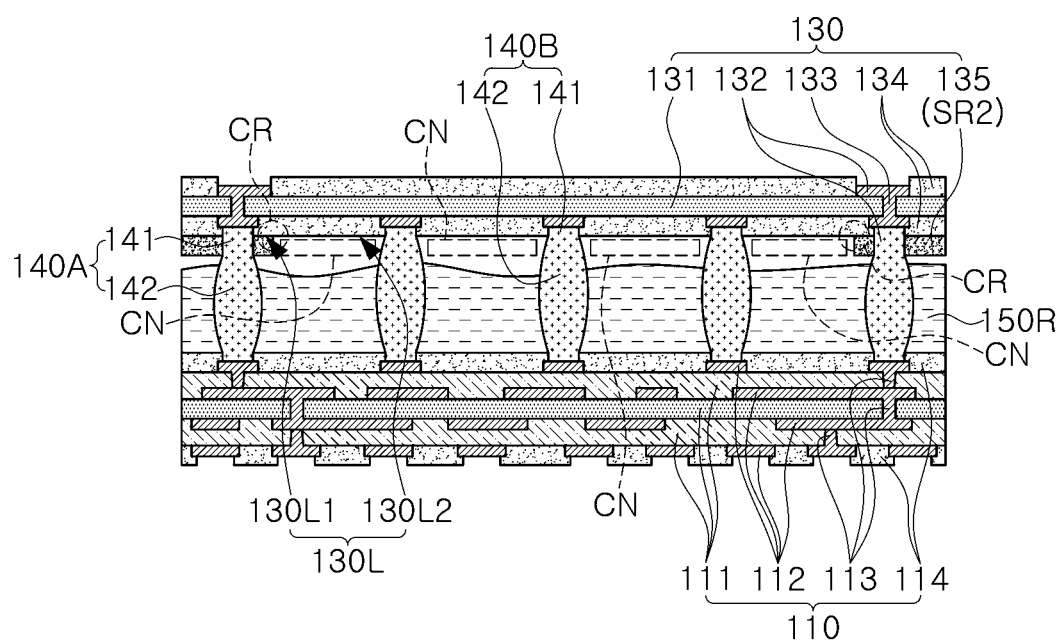

FIGS. 9A to 9C are cross-sectional views illustrating a manufacturing process of the semiconductor package 100A illustrated in FIG. 1B.

Referring to FIG. 9A, the upper substrate 130 may be attached to the lower substrate 110 on which the second preliminary connection structures 140*p*2 and the flux layer FL are formed. The lower substrate 110 may be in a state in which the semiconductor chip (120' in FIG. 1A) is mounted thereon as shown in FIG. 1A. The second preliminary connection structures 140*p*2 may have the same characteristics as those of the first preliminary connection structures 140*p*1 described above with reference to FIG. 8D. The upper substrate 130 may be aligned on the lower substrate 110 such that the first preliminary connection structures 140*p*1 and the second preliminary connection structures 140*p*2 vertically overlap. The first preliminary connection structures 140*p*1 may include a first group G1 disposed below the first surface 130L1 of the upper substrate 130 and a second group G2 disposed below the second surface 130L2 of the upper substrate 130. Since the first preliminary connection structures 140*p*1 of the first group G1 are close to the second preliminary connection structures 140*p*2 by the height of the step structures 135, the first preliminary connection structures 140*p*1 of the first group may be formed to be smaller in volume than that of the first preliminary connection structures 140*p*1 of the second group G2 (a small amount of solder paste is bumped).

Referring to FIG. 9B, a cleaning process of forming the connection structure 140 and removing flux residues may be performed. The connection structure 140 may be formed using a reflow process. During the reflow process, the joint pitch (e.g., vertical height of the body of the connection structures) may be decreased, thereby improving electrical properties. After the reflow process, flux residues may be removed by introducing a flux cleaning solution (e.g., purified water) between the lower substrate 110 and the upper substrate 130. The flux cleaning solution may be sprayed in a direction passing through the channel region CN. According to the present embodiment, by securing a distribution path of the cleaning solution through the channel region CN passing between the step structures 135, even the flux remaining in the corner portions CR of the step structures 135 may be effectively removed. For example, the step structures 135 create a more focused channel through which the flux cleaning solution can travel for a more effective cleaning.

Referring to FIG. 9C, an encapsulant (150' in FIG. 1B) may be formed by injecting a molding resin 150R between the lower substrate 110 and the upper substrate 130. The molding resin 150R may include a liquid or gel-type insulating resin (e.g., EMC). According to the present inventive concept, as described above, the filling properties of the molding resin 150R may be improved by effectively removing the flux residues. In addition, by securing the filling path of the molding resin 150R through the channel region CN passing between the step structures 135, the molding resin 150R may be formed up to the corner portion CR of the step structures 135. The molding resin 150R may be a single integrally formed material, which contacts bottom surfaces and side surfaces of the step structures 135. Thereafter, the connection bumps (160' in FIG. 1B) and/or passive elements (170' in FIG. 1A) may be mounted below the lower substrate 110, thereby completing a semiconductor package.

According to example embodiments of the present inventive concept, a semiconductor package having a minimized thickness may be provided by introducing an upper substrate including a cavity region.

In addition, a semiconductor package having excellent filling properties of an encapsulant may be provided by introducing a channel region crossing the lower surface of the upper substrate.

While example embodiments have been shown and described above, it will be apparent to those skilled in the art that modifications and variations could be made without departing from the scope of the present inventive concept as defined by the appended claims.

What is claimed is:

1. A semiconductor package comprising:
a lower substrate including a lower wiring layer structure;
a semiconductor chip disposed on the lower substrate and electrically connected to the lower wiring layer structure;
an upper substrate disposed on the semiconductor chip, having a lower surface facing the semiconductor chip, first edges opposing each other in a first direction, and second edges opposing each other in a second direction, intersecting the first direction, and including first step structures extending in the second direction, below the lower surface and adjacent to the first edges, and an upper wiring layer structure;
a connection structure disposed between the lower substrate and the upper substrate to connect the lower wiring layer structure and the upper wiring layer structure and including first connectors adjacent to the first edges and second connectors adjacent to the second edges;
an encapsulant filling a space between the lower substrate and the upper substrate and sealing at least a portion of each of the semiconductor chip and the connection structure; and
connection bumps disposed below the lower substrate and electrically connected to the lower wiring layer structure,
wherein the semiconductor package has a channel region below the lower surface of the upper substrate, the channel region extending between the second edges and passing through a space between the second connectors.

2. The semiconductor package of claim 1, wherein the first connectors are arranged in a row at a first interval, and the second connectors are arranged in a row at a second interval greater than the first interval.

3. The semiconductor package of claim 2, wherein the first interval is in the range of about 100 μm to about 500 μm, and the second interval is in the range of about 500 μm to about 1000 μm, so that the second interval is at least 1.1 times the first interval.

4. The semiconductor package of claim 1, wherein the second connectors are electrically insulated from the first connectors.

5. The semiconductor package of claim 1, wherein:
The upper substrate further includes second step structures disposed to be spaced apart from each other below the lower surface and adjacent to the second edges, and the second connectors are disposed below the second step structures.

6. The semiconductor package of claim 5, wherein the channel region includes a plurality of channel regions passing between the second step structures.

7. The semiconductor package of claim 1, wherein the first connectors and the second connectors include tin (Sn) or an alloy of tin (Sn).

8. The semiconductor package of claim 1, wherein the upper substrate includes an insulating layer on which the upper wiring layer structure is disposed, a first solder resist layer disposed below the insulating layer, and a second solder resist layer disposed below a bottom surface of the first solder resist layer.

9. The semiconductor package of claim 8, wherein
the first solder resist layer provides the lower surface of the upper substrate, and
the second solder resist layer provides the first step structures.

10. The semiconductor package of claim 1, wherein the upper substrate includes an insulating layer on which the upper wiring layer structure is directly disposed, and a first solder resist layer disposed below and contacting the insulating layer.

11. The semiconductor package of claim 10, wherein the insulating layer provides the lower surface of the upper substrate, and the first solder resist layer provides the first step structures.

12. The semiconductor package of claim 1, wherein
the lower surface of the upper substrate has a first surface portion on which the first step structures are disposed and a second surface portion on which the first step structures are not disposed, and
the second surface portion is at a vertical level higher than a level of lower surfaces of the first step structures.

13. The semiconductor package of claim 12, wherein the channel region corresponds to at least part of the second surface portion.

14. The semiconductor package of claim 1, wherein
the first step structures include openings exposing at least a portion of the upper wiring layer structure, and
the first connectors are disposed below the first step structures and are electrically connected to the upper wiring layer structure through the openings.

15. The semiconductor package of claim 1, wherein the upper substrate further includes a plurality of patch structures disposed on the lower surface to overlap the semiconductor chip.

16. A semiconductor package comprising:
a lower substrate including a lower wiring layer structure;
a semiconductor chip disposed on the lower substrate and electrically connected to the lower wiring layer structure;
an upper substrate disposed on the semiconductor chip, having a lower surface facing the semiconductor chip, and including step structures arranged at a first vertical level below the lower surface and an upper wiring layer structure;
a connection structure disposed between the lower substrate and the upper substrate to electrically connect the lower wiring layer structure and the upper wiring layer structure; and
a cavity region overlapping the semiconductor chip in a direction perpendicular to the lower surface, the cavity region formed between the step structures and between two channel regions between the step structures, the two channel regions each extending to edges of the upper substrate opposing each other and formed at the first vertical level.

17. The semiconductor package of claim 16, wherein at least an additional channel region formed at the first vertical level intersects the cavity region.

18. A semiconductor package comprising:
a lower substrate;
a semiconductor chip disposed on the lower substrate;
an upper substrate disposed on the semiconductor chip, having a lower surface facing the semiconductor chip, and including step structures disposed below the lower surface;
a connection structure disposed around the semiconductor chip and connecting the lower substrate to the upper substrate; and
an encapsulant filling a space between the lower substrate and the upper substrate and sealing at least a portion of each of the semiconductor chip and the connection structure,
wherein the lower surface of the upper substrate has a first surface portion on which the step structures are disposed and a second surface portion having a step with respect to the lower surface of the step structures, and the second surface portion extends between opposite edges of the upper substrate.

19. The semiconductor package of claim 18, wherein the connection structure includes first connectors disposed below the first surface portion and second connectors disposed below the second surface portion.

20. The semiconductor package of claim 19, wherein the second surface portion passes between the second connectors.

* * * * *